United States Patent
Nakata

(10) Patent No.: US 10,804,360 B2
(45) Date of Patent: Oct. 13, 2020

(54) SILICON CARBIDE SEMICONDUCTOR DEVICE, ELECTRIC POWER CONVERSION DEVICE, METHOD FOR PRODUCING SILICON CARBIDE SEMICONDUCTOR DEVICE, AND METHOD FOR PRODUCING ELECTRIC POWER CONVERSION DEVICE

(71) Applicant: Mitsubishi Electric Corporation, Chiyoda-ku, Tokyo (JP)

(72) Inventor: Kazunari Nakata, Tokyo (JP)

(73) Assignee: MITSUBISHI ELECTRIC CORPORATION, Chiyoda-ku, Tokyo (JP)

( * ) Notice: Subject to any disclaimer, the term of this patent is extended or adjusted under 35 U.S.C. 154(b) by 0 days.

(21) Appl. No.: 16/487,176

(22) PCT Filed: Apr. 4, 2018

(86) PCT No.: PCT/JP2018/014751
§ 371 (c)(1),
(2) Date: Aug. 20, 2019

(87) PCT Pub. No.: WO2018/190271
PCT Pub. Date: Oct. 18, 2018

(65) Prior Publication Data
US 2020/0058742 A1     Feb. 20, 2020

(30) Foreign Application Priority Data

Apr. 14, 2017    (JP) .................................. 2017-080307

(51) Int. Cl.
*H01L 29/34*     (2006.01)
*H01L 29/16*     (2006.01)
(Continued)

(52) U.S. Cl.
CPC .......... *H01L 29/1608* (2013.01); *H01L 29/47* (2013.01); *H01L 29/66143* (2013.01); *H01L 29/872* (2013.01); *H02M 7/48* (2013.01)

(58) Field of Classification Search
CPC ................................. H01L 29/30; H01L 29/34
See application file for complete search history.

(56) References Cited

U.S. PATENT DOCUMENTS

2008/0277765 A1* 11/2008 Lane ................... H01L 23/5329
                                                                257/622
2011/0303895 A1* 12/2011 Lin ....................... H01L 33/647
                                                                 257/13
(Continued)

FOREIGN PATENT DOCUMENTS

| JP | 2005243947 A | 9/2005 |
| JP | 2014011342 A | 1/2014 |
| JP | 2015146406 A | 8/2015 |

OTHER PUBLICATIONS

International Search Report (PCT/ISA/210) dated Jul. 3, 2018, by the Japan Patent Office as the International Searching Authority for International Application No. PCT/JP2018/014751.
(Continued)

*Primary Examiner* — Jae Lee
(74) *Attorney, Agent, or Firm* — Buchanan Ingersoll & Rooney PC

(57) ABSTRACT

A semiconductor layer has a first face, a second face, and a first side face. A silicon carbide substrate has a third face facing the second face, a fourth face, and a second side face. A first electrode layer forms an interface with part of the first face. An insulation film is provided around the first electrode layer on the first face of the semiconductor layer. A second electrode layer is provided on the fourth face and extends outward of the interface between the first face and the first electrode layer in an in-plane direction. A crush layer is
(Continued)

provided on the first side face of the semiconductor layer and on the second side face of the silicon carbide substrate. The thickness of the crush layer on the second side face is greater than the thickness of the crush layer on the first side face.

14 Claims, 31 Drawing Sheets

(51) Int. Cl.
    *H01L 29/47*     (2006.01)
    *H01L 29/66*     (2006.01)
    *H01L 29/872*     (2006.01)
    *H02M 7/48*     (2007.01)

(56) References Cited

U.S. PATENT DOCUMENTS

2013/0234160 A1* 9/2013 Matsuno ............. H01L 23/3185
                                                                                 257/77
2016/0218067 A1* 7/2016 Masuko ................. H01L 21/78
2016/0300825 A1* 10/2016 Hoeppel ............. H01L 31/1876

OTHER PUBLICATIONS

Written Opinion (PCT/ISA/237) dated Jul. 3, 2018, by the Japan Patent Office as the International Searching Authority for International Application No. PCT/JP2018/014751.

* cited by examiner

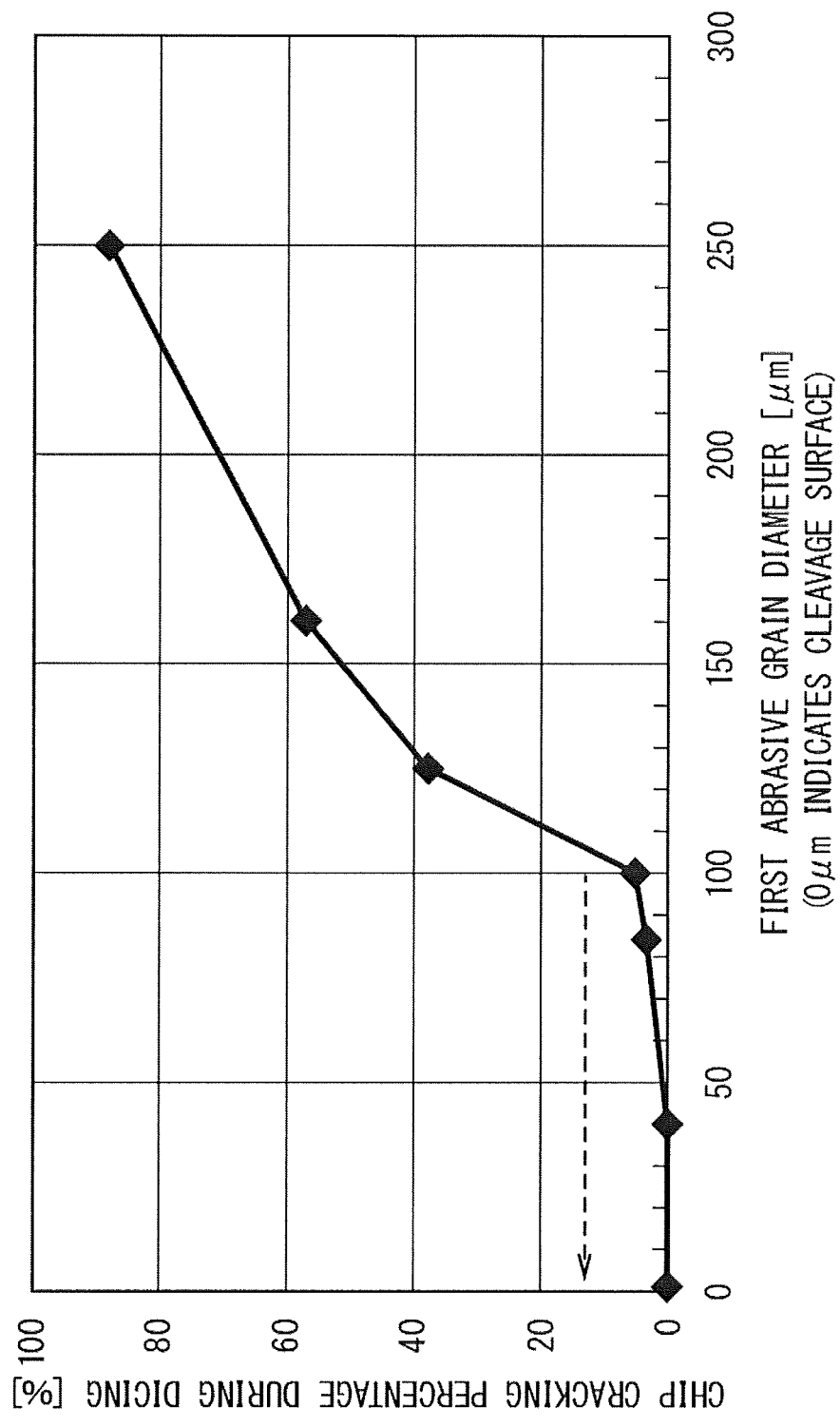

F I G. 2 2
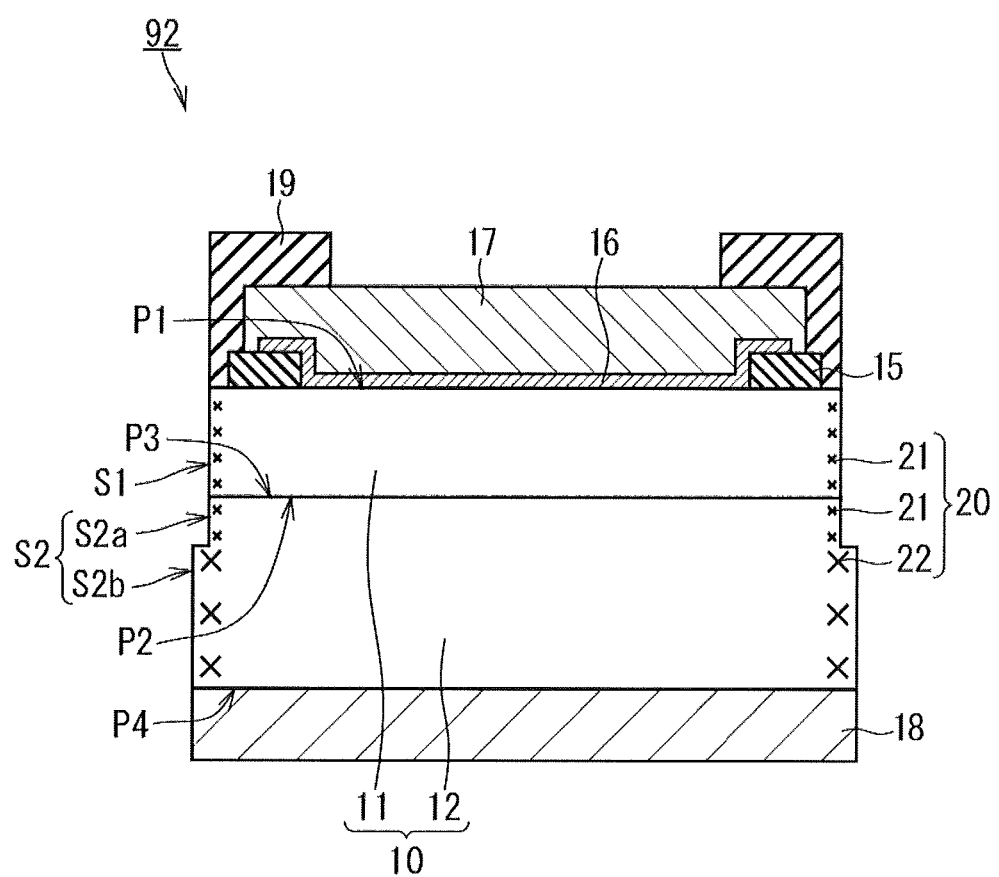

F I G. 3 5
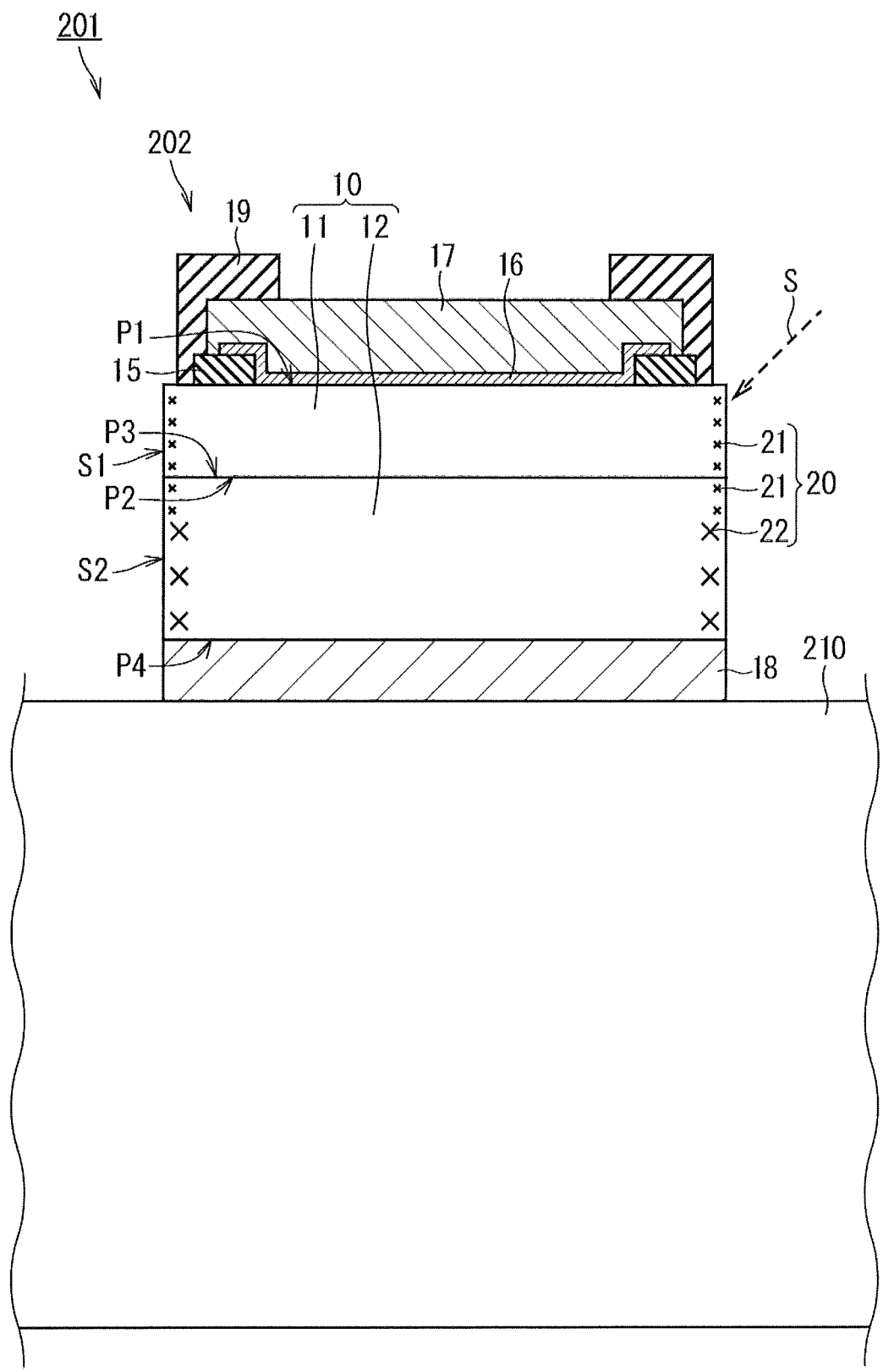

SILICON CARBIDE SEMICONDUCTOR DEVICE, ELECTRIC POWER CONVERSION DEVICE, METHOD FOR PRODUCING SILICON CARBIDE SEMICONDUCTOR DEVICE, AND METHOD FOR PRODUCING ELECTRIC POWER CONVERSION DEVICE

TECHNICAL FIELD

The present invention relates to a silicon carbide semiconductor device, an electric power conversion device, a method for producing a silicon carbide semiconductor device, and a method for producing an electric power conversion device.

BACKGROUND ART

In order to enable, for example, higher withstand voltages and lower loss of semiconductor devices and the use of semiconductor devices in high-temperature environments, silicon carbide (SiC) semiconductor devices are beginning to be employed, instead of silicon (Si) semiconductor devices. In particular, SiC is beginning to be applied as a semiconducting material for electric power semiconductor devices such as metal-oxide-semiconductor field-effect transistors (MOSFETs) and Schottky barrier diodes (SBDs). For example, in the case of an SiC-MOSFET with a withstand voltage level of 1 kV to 1.2 kV, a low on-state resistance of 5 m $\Omega cm^2$ or less can be achieved, and this resistance is half of or less than that achieved with an Si-MOSFET or Si-insulated gate bipolar transistor (Si-IGBT) with the same withstand voltage level. The reason why the on-state resistance can be reduced significantly is that the dielectric breakdown electric field of SiC is higher than that of Si. A high dielectric breakdown electric field makes it possible to reduce on-state resistance by further reducing the thickness of a withstand voltage layer (drift layer) or increasing the amount of impurity doping in the withstand voltage layer while maintaining a satisfactory withstand voltage. With advances in areas such as reduction of production costs, improvement in process technology, and improvement in device performance, SiC semiconductor devices become more common and, in particular, most of Si-IGBTs that serve as inverter parts are considered to be replaced by SiC semiconductor devices.

According to Japanese Patent Application Laid-Open No. 2014-11342 (Patent Document 1), a semiconductor substrate for use in SiC-SBD has a layered structure including an $n^+$-type substrate of SiC and an $n^-$-type drift layer that is disposed on the upper face of the $n^+$-type substrate and has a lower impurity concentration than that of the $n^+$-type substrate. On the surface of the $n^-$-type drift layer, an insulation film is provided with an opening, which corresponds to a cell region. In the opening, a Schottky electrode is provided in contact with the $n^-$-type drift layer. On the rear face of the $n^+$-type substrate, an ohmic electrode is provided. A region of the interface between the $n^-$-type drift layer and the Schottky electrode is limited by the size of the opening of the insulation film. Thus, the ohmic electrode provided on the rear face side in this device structure generally extends outward of the Schottky electrode provided on the upper face side in plan view.

In the production of the above-described SiC-SBD, a dicing step is performed to divide the SiC-SBD in units of chips. According to the above-described publication, a dicing blade is used for this dicing. The insulation film is formed with a groove in order to hamper extension of cracks that can be generated during dicing.

On the other hand, Japanese Patent Application Laid-Open No. 2015-146406 (Patent Document 2) proposes to cleave a substrate, instead of cutting the substrate with a blade. The above publication has argued that, if a cleavage surface is formed so as to be join to the main face of a substrate, unlike in the case of using a blade, it is possible to prevent a damaged layer from being exposed to the end face of the substrate. This helps reducing the dislocation density in the end face of the substrate, particularly in a portion of the end face on the aforementioned main face side. Accordingly, it is possible to suppress generation of leakage current via the end face of the substrate in a vertical electronic device that requires high withstand voltage.

PRIOR ART DOCUMENTS

Patent Documents

Patent Document 1: Japanese Patent Application Laid-Open No. 2014-11342
Patent Document 2: Japanese Patent Application Laid-Open No. 2015-146406

SUMMARY

Problems to be Solved by the Invention

In the SBD disclosed in the above-described Japanese Patent Application Laid-Open No. 2014-11342, the ohmic electrode provided on the rear face side extends outward of the Schottky electrode provided on the upper face side in plan view. Thus, current flowing from the outer peripheral portion of the ohmic electrode toward the Schottky electrode is likely to be concentrated on the outer edges of the interface between the Schottky electrode and the $n^-$-type drift layer. This current concentration is more noticeable in the case where SiC is used as a semiconducting material, because the device can be operated at a high current density. Accordingly, a dielectric breakdown will easily occur at this location where the current concentration has occurred. Note that similar problems also arise with different vertical semiconductor devices other than SBDs. For example, in the case of an MOSFET, the drain electrode provided on the rear face side generally extends outward of the source electrode provided on the upper face side in plan view. This can cause similar current concentration to that described above.

According to the technique disclosed in Japanese Patent Application Laid-Open No. 2015-146406 described above, the employment of cleavage can reduce crystal defects at the end face of the substrate. Thus, surface current flowing on the end face of the substrate decreases, and this can be useful in suppressing leakage current. On the other hand, the inventors of the present invention have considered that, if the above-described technique is used, the aforementioned current concentration will become more noticeable with respect to current flowing during normal operations (e.g., forward current in diodes and on-state current in switching elements), the details of which will be described later. Therefore, the use of the above-described technique may on the contrary impair reliability.

The present invention has been made in order to solve the problems as described above, and it is an object of the present invention to provide a silicon carbide semiconductor device that enables suppressing the occurrence of dielectric breakdowns caused by local current concentration.

Means to Solve the Problem

A silicon carbide semiconductor device according to the present invention includes a semiconductor layer, a silicon carbide substrate, a first electrode layer, an insulation film, and a second electrode layer. The semiconductor layer has a first face, a second face opposite the first face, and a first side face that connects the first face and the second face. The silicon carbide substrate has a third face that faces the second face, a fourth face opposite the third face, and a second side face that connects the third face and the fourth face. The first electrode layer is disposed apart from an edge of the first face of the semiconductor layer and forms an interface with part of the first face. The insulation film is provided around the first electrode layer on the first face of the semiconductor layer. The second electrode layer is provided on the fourth face of the silicon carbide substrate and extends outward of the interface between the first face of the semiconductor layer and the first electrode layer in an in-plane direction. A crush layer is provided on the first side face of the semiconductor layer and on the second side face of the silicon carbide substrate. A thickness of the crush layer on the second side face is greater than a thickness of the crush layer on the first side face.

A method for producing a silicon carbide semiconductor device according to the present invention includes the following steps. A wafer is prepared that includes a semiconductor layer having a first face and a second face opposite the first face, a silicon carbide substrate having a third face that faces the second face of the semiconductor layer and a fourth face opposite the third face, a first electrode layer forming an interface with part of the first face, an insulation film provided around the first electrode layer on the first face of the semiconductor layer, and a second electrode layer provided on the fourth face of the silicon carbide substrate and extending outward of the interface between the first face of the semiconductor layer and the first electrode layer in an in-plane direction. The wafer is diced. The step of dicing the wafer includes the steps of forming a first side face that connects the first face and the second face, by cutting the semiconductor layer, and forming a second side face that connects the third face and the fourth face, by cutting the silicon carbide substrate. The step of dicing the wafer is performed so that a crush layer is formed on the first side face of the semiconductor layer and on the second side face of the silicon carbide substrate, and that a thickness of the crush layer on the second side face becomes greater than a thickness of the crush layer on the first side face.

Effects of the Invention

In the case where the second electrode layer is provided with a portion that extends outward of the interface between the first face of the semiconductor layer and the first electrode layer in the in-plane direction, current that flows from this portion of the second electrode layer toward the first electrode layer through the vicinity of the second side face of the silicon carbide substrate is likely to be concentrated on the outer edge of the interface between the first electrode layer and the semiconductor layer. According to the present invention, at least part of this current is trapped by the crush layer provided on the second side face, when passing through the vicinity of the second side face of the silicon carbide substrate. This moderates the above-described current concentration. How much current is trapped depends on the thickness of the crush layer on the second side face. Thus, if the crush layer on the second side face has a sufficient thickness, it is possible to sufficiently suppress the occurrence of dielectric breakdowns caused by current concentration. On the other hand, if the crush layer on the first side face has an excessively great thickness, cracking will easily occur in the silicon carbide semiconductor device due to external influences, particularly stress. According to the present invention, the thickness of the crush layer on the second side face is greater than the thickness of the crush layer on the first side face. This enables suppressing the occurrence of dielectric breakdowns caused by local current concentration in the semiconductor layer while suppressing the occurrence of cracking in the silicon carbide semiconductor device.

The object, features, and advantages relating to the technique disclosed in the specification of the present application will become further apparent from the following detailed description and the accompanying drawings.

BRIEF DESCRIPTION OF DRAWINGS

FIG. 21 is a graphical diagram illustrating an exemplary relationship between a first abrasive grain diameter aid a chip cracking percentage during dicing.

FIG. 22 is a sectional view schematically illustrating a configuration of a silicon carbide semiconductor device according to Embodiment 2 of the present invention.

FIG. 35 is a partial sectional view schematically illustrating an exemplary configuration of a main converter circuit of the electric power conversion device in FIG. 34.

DESCRIPTION OF EMBODIMENTS

Embodiments of the present invention will be described hereinafter with reference to the drawings. Note that identical or corresponding constituent elements in the following drawings are given the same reference signs, and a repeated description thereof is omitted.

Embodiment 1

Configuration

Figure 1:
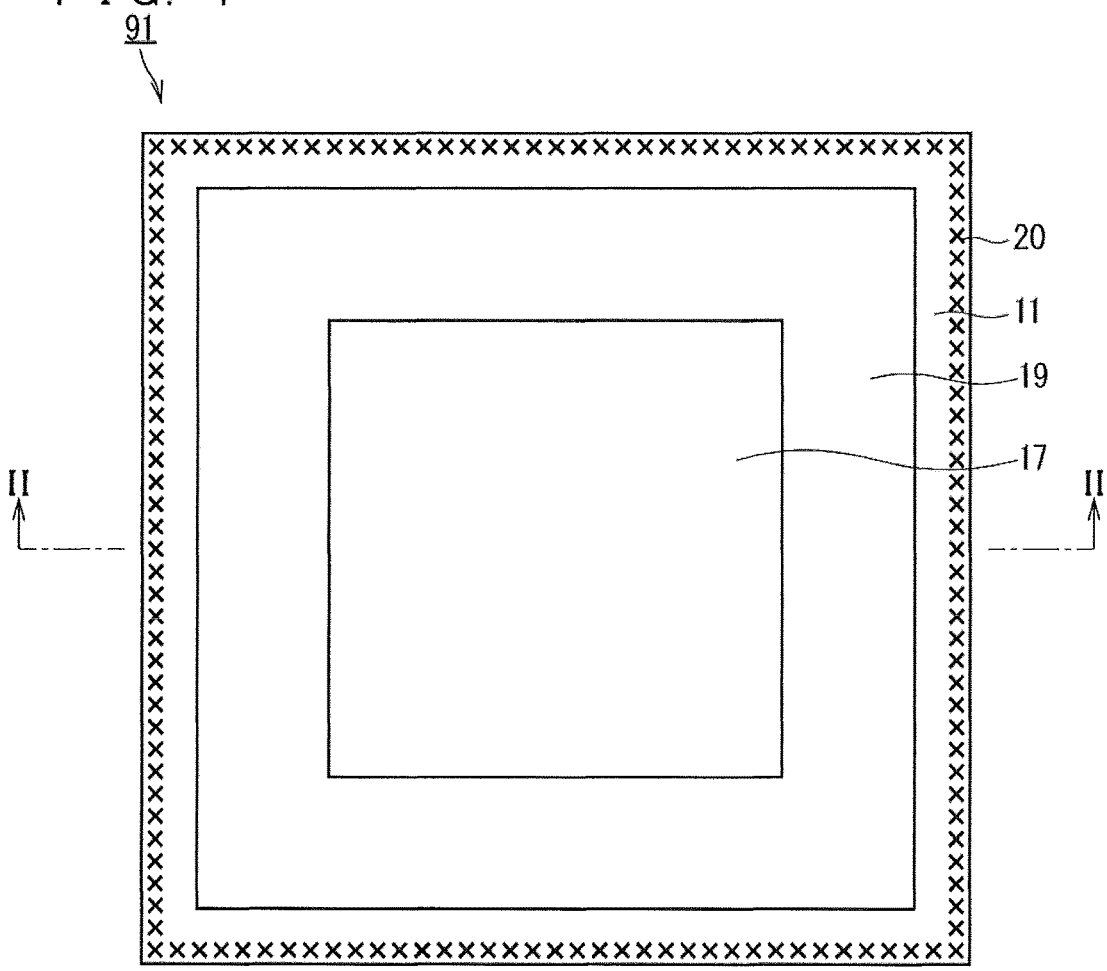
FIG. 1 is a plan view schematically illustrating a configuration of a silicon carbide semiconductor device according to Embodiment 1 of the present invention.
Figure 2:
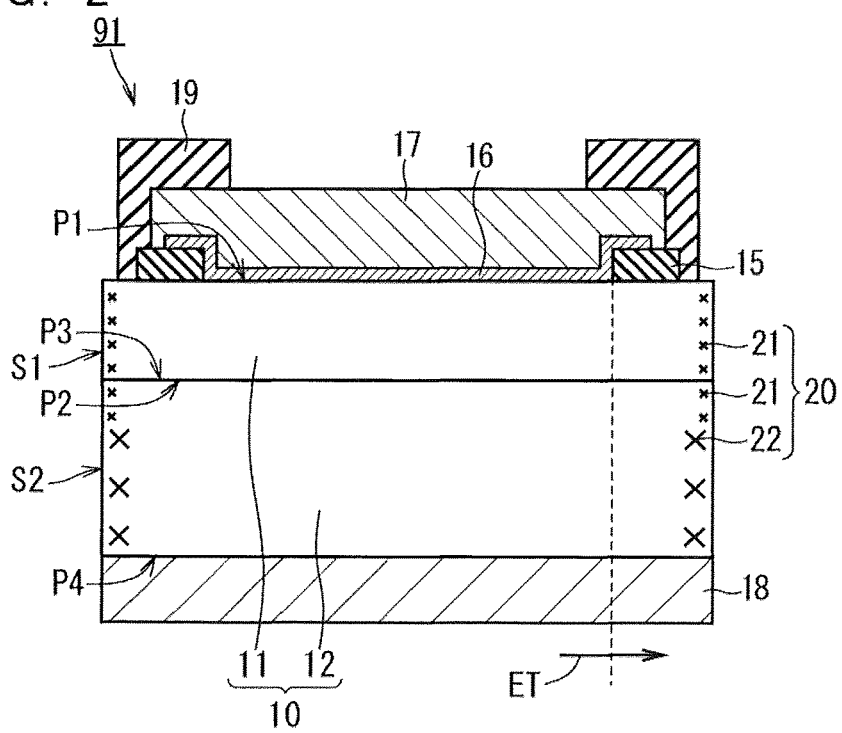
FIG. 2 is a sectional view taken along a line II-II in FIG. 1.
Figure 3:
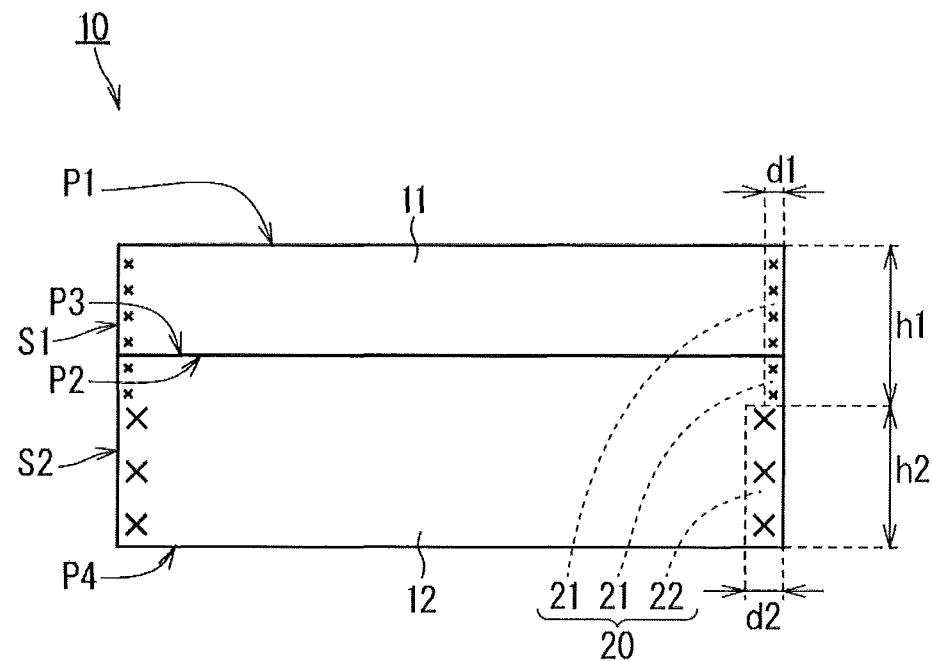
FIG. 3 is a sectional view schematically illustrating a configuration of a semiconductor substrate of the silicon carbide semiconductor device in FIG. 2.

FIG. 1 is a plan view schematically illustrating a configuration of an SBD 91 (silicon carbide semiconductor device) according to Embodiment 1 of the present invention. FIG. 2 is a sectional view taken along a line II-II in FIG. 1. FIG. 3 is a sectional view schematically illustrating a configuration of an epitaxial substrate 10 (semiconductor substrate) of the SBD 91 in FIG. 2.

The SBD 91 includes the epitaxial substrate 10, a Schottky electrode layer 16 (first electrode layer), an interlayer insulating layer 15 (insulation film), a backside electrode layer 18 (second electrode layer), a frontside electrode layer 17, and a passivation layer 19.

The epitaxial substrate 10 includes a drift layer 11 (semiconductor layer) and an SiC substrate 12 (silicon carbide substrate). The SiC substrate 12 is a single-crystal substrate, and the drift layer 11 is an epitaxial layer formed on the SiC substrate. The drift layer 11 has a face P1 (first face), a face P2 (second face) opposite the face P1, and a side face S1 (first side face) connecting the faces P1 and P2. The drift layer 11 is of an n-type. A portion of the drift layer 11 that forms at least the face P2 is preferably formed of SiC, and typically the entire drift layer 11 is formed of SiC. The SiC substrate 12 has a face P3 (third face) that faces the face P2 of the drift layer 11, a face P4 (fourth face) opposite the face P3, and a side face S2 (second side face) connecting the faces P3 and P4. The SiC substrate 12 is of an n-type and has a higher impurity concentration than that of the drift layer 11. Thus, the impurity concentration of the drift layer 11 is lower than that of the SiC substrate 12. Note that the drift layer 11 may have a multilayer structure, and for example, the drift layer 11 may have a first drift region that forms the face P2, and a second drift region that is disposed on the first drift region and forms the face P4. The first drift region and the second drift region may have different impurity concentrations.

The Schottky electrode layer 16 makes a Schottky junction with the drift layer 11. The Schottky electrode layer 16 is disposed apart from the edge of the face P1 of the drift layer 11 and forms an interface with part of the face P1. A region of this interface of the face P1 is a cell region, and a region around the cell region is an outer peripheral region.

The cell region has a device function (specifically, rectification function) that is the objective of the SBD 91, and the outer peripheral region has the function of suppressing breakdowns of the SBD 91 caused by discharge occurring in the outer peripheral portion of the epitaxial substrate 10. The frontside electrode layer 17 is provided on the Schottky electrode layer 16.

The interlayer insulating layer 15 is provided around the Schottky electrode layer 16 on the face P1 of the drift layer 11. The interlayer insulating layer 15 is in contact with the Schottky electrode layer 16. The Schottky electrode layer 16 typically has an end portion that is disposed on the interlayer insulating layer 15, and it is in contact with the drift layer 11 in the opening of the interlayer insulating layer 15.

The passivation layer 19 can be provided as an outermost peripheral structure on the face P1 of the drift layer 11. The passivation layer 19 is formed of an insulator.

The backside electrode layer 18 is provided on the face P4 of the SiC substrate 12, and in the example illustrated in FIG. 2, it is provided on the entire face P4. The backside electrode layer 18 makes an ohmic junction with the face P4 of the SiC substrate 12. The backside electrode layer 18 opposes the Schottky electrode layer 16 in the longitudinal direction. Thus, the main current in the SBD 91 flows in the longitudinal direction in FIG. 2. Accordingly, the SBD 91 serves as a vertical semiconductor device, or in other words, a front-back conductive semiconductor device. Each of the frontside electrode layer 17 and the backside electrode layer 18 can be wired to the outside of the SBD 91 with an appropriate member such as wire bonding or soldering.

As illustrated in FIG. 2, the backside electrode layer 18 extends outward of the interface between the face P1 of the drift layer 11 and the Schottky electrode layer 16 in an in-plane direction (which is a lateral direction in the drawing and typically a direction parallel to each of the faces P1 to P4) as indicated by an arrow ET. In other words, the backside electrode layer 18 extends farther toward the outer periphery (in the direction indicated by the arrow ET) than the interface between the face P1 of the drift layer 11 and the Schottky electrode layer 16. Typically, the above-described interface is included in the backside electrode layer 18 and has a smaller area than the area of the backside electrode layer 18 in plan view (plan layout).

On the side face of the epitaxial substrate 10, a crush layer 20 is provided. In other words, the crush layer 20 is provided on the side face S1 of the drift layer 11 and on the side face S2 of the SiC substrate 12. Specifically, the crush layer 20 includes a first crush layer 21 and a second crush layer 22. The first crush layer 21 is provided on the side face S1 of the drift layer 11, and the second crush layer 22 is provided on at least part of the side face S2 of the SiC substrate 12. In the example illustrated in FIG. 2, the first crush layer 21 is provided on the side face S1 and on part of the side face S2, and the second crush layer 22 is provided on the other part of the side face S2. The "crush layer" as used herein refers to a layer that includes at least either of amorphous and polycrystalline layers formed during dicing of the epitaxial substrate 10. Thus, the crush layer may be mixed with a slight amount of fine extraneous materials generated from a dicing blade. If such extraneous materials are ignored, the composition of the crush layer is substantially the same as that of the base material for the crush layer. Specifically, the composition of the crush layer 20 on the side face S1 of the drift layer 11 is substantially the same as that of the drift layer 11, and the composition of the crush layer 20 on the side face S2 of the SiC substrate 12 is substantially the same as that of the SiC substrate 12.

The thickness of the second crush layer 22 is greater than that of the first crush layer 21. The second crush layer 22 preferably has a thickness greater than or equal to 0.1 μm. The second crush layer 22 preferably reaches the edge of the face P4 of the SiC substrate 12. The first crush layer 21 preferably reaches the edge of the face P1 of the drift layer 11. The boundary between the first crush layer 21 and the second crush layer 22 is located within the SiC substrate 12 or at the boundary between the SiC substrate 12 and the drift layer 11.

The side face S2 has a first portion (upper portion in FIG. 2) joined to the face P3 and a second portion (lower portion in FIG. 2) joined to the face P4. Preferably, the boundary between the first crush layer 21 and the second crush layer 22 is located within the SiC substrate 12, and in this case, the thickness of the crush layer 20 on the side face S1 and the thickness of the crush layer 20 on the aforementioned first portion of the side face S2 are each less than the thickness of the crush layer on the aforementioned second portion of the side face S2.

In the example illustrated in FIG. 3, the first crush layer 21 has a thickness d1, the second crush layer 22 has a thickness d2, and d1<d2 is satisfied. Here, the thickness of the crush layer is defined as a dimension in the in-plane direction (lateral direction in the drawing) of the epitaxial substrate 10. In other words, the thickness of the crush layer represents the dimension of the crush layer formed from the side face of the epitaxial substrate 10 to the inside thereof.

The first crush layer 21 has a height dimension h1, and a second crush layer 22 has a height dimension h2. Here, the height dimension of the crush layer is defined as a dimension in the direction perpendicular to the in-plane direction, or in other words, a thickness direction (longitudinal direction in the drawing) of the epitaxial substrate 10. A sum of the height dimension hi and the height dimension h2 corresponds to the thickness of the epitaxial substrate 10. In the case where the first crush layer 21 spans from the side face S1 to the side face S2 as in the drawing, the height dimension hi is greater than the thickness of the drift layer 11, and the height dimension h2 is smaller than the thickness of the SiC substrate 12. The height dimension h1 and the height dimension h2 are each preferably within a range of one fourth to third fourth of the total thickness (dimension in the longitudinal direction in the drawing) of the epitaxial substrate 10.

The thickness of the crush layer 20 on the side face S2 is greater than that of the crush layer 20 on the side face S1. Here, the crush layer 20 on the side face S1 does not necessarily have to have a constant thickness. In that case, the "thickness of the crush layer 20 on the side face S1" is defined by a maximum thickness of the crush layer 20 on the side face S1. Similarly, the crush layer 20 on the side face S2 does not necessarily have to have a constant thickness. In that case, the "thickness of the crush layer 20 on the side face S2" is defined by a maximum thickness of the crush layer 20 on the side face S2. For example, in the example illustrated in FIG. 3, the portion of the crush layer 20 on the side face S1 generally has the thickness di, and therefore the thickness of the crush layer 20 on the side face S1 is assumed to be d1. On the other hand, the portion of the crush layer 20 on the side face S2 includes a portion with the thickness d1 and a portion with the thickness d2. Thus, the thickness of the crush layer 20 on the side face S2 is assumed to be the thickness d2 according to the above definition. This satisfies the condition that the thickness of crush layer 20 on the side face S2 is greater than that of the crush layer 20 on the side face S1.

The thickness of the crush layer 20 on the side face S2 is preferably greater than or equal to 0.1 µm. This condition is satisfied if the second crush layer 22 has a thickness greater than or equal to 0.1 µm.

First Half of Production Method

Figure 4:
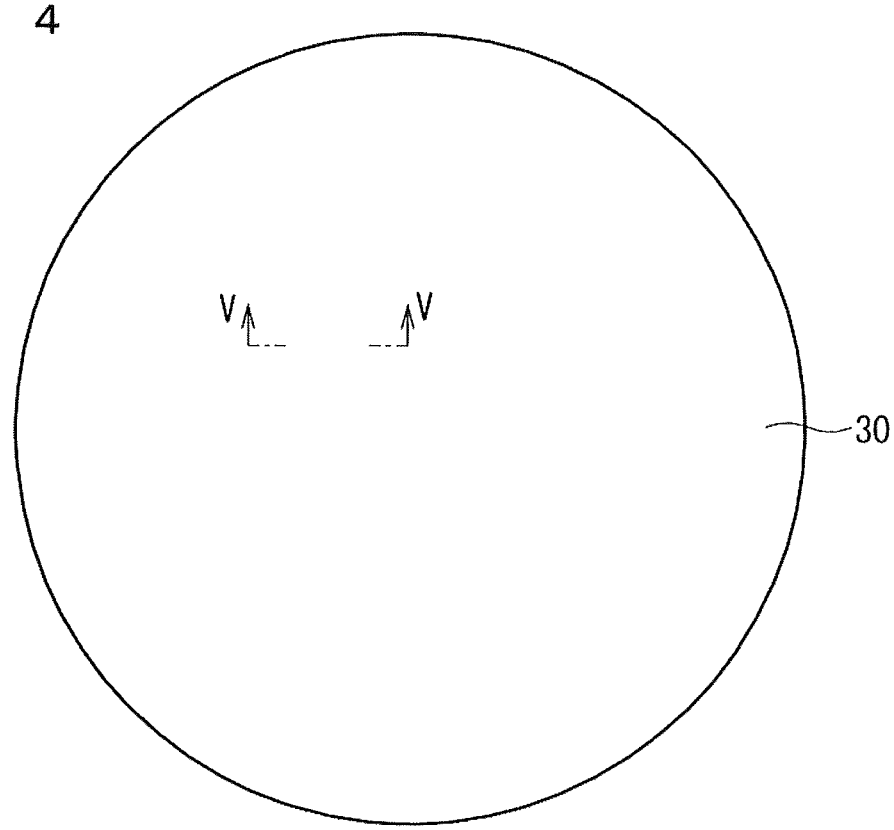
FIG. 4 is a plan view schematically illustrating a first step in the method for producing a silicon carbide semiconductor device according to Embodiment 1 of the present invention.
Figure 5:
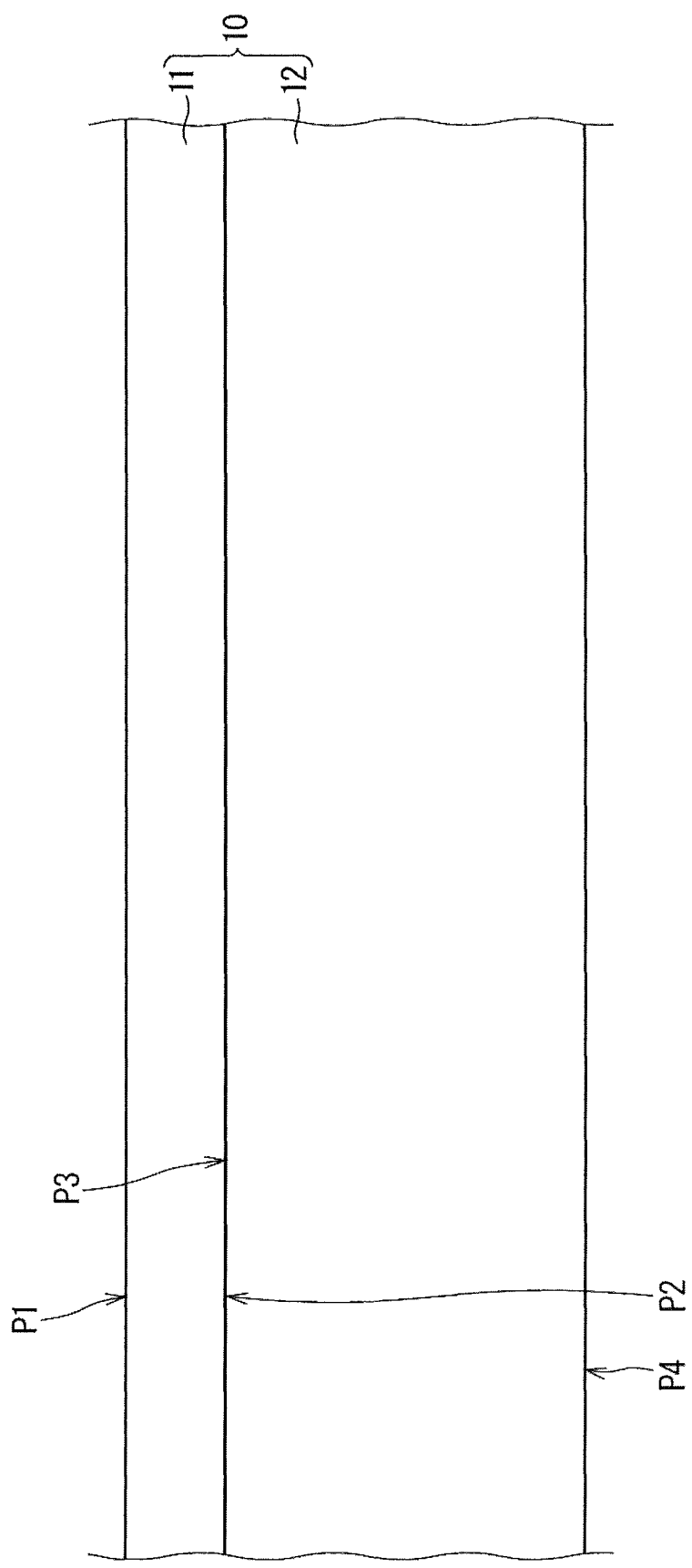
FIG. 5 is a partial sectional view taken along a line V-V in FIG. 4.
Figure 11:
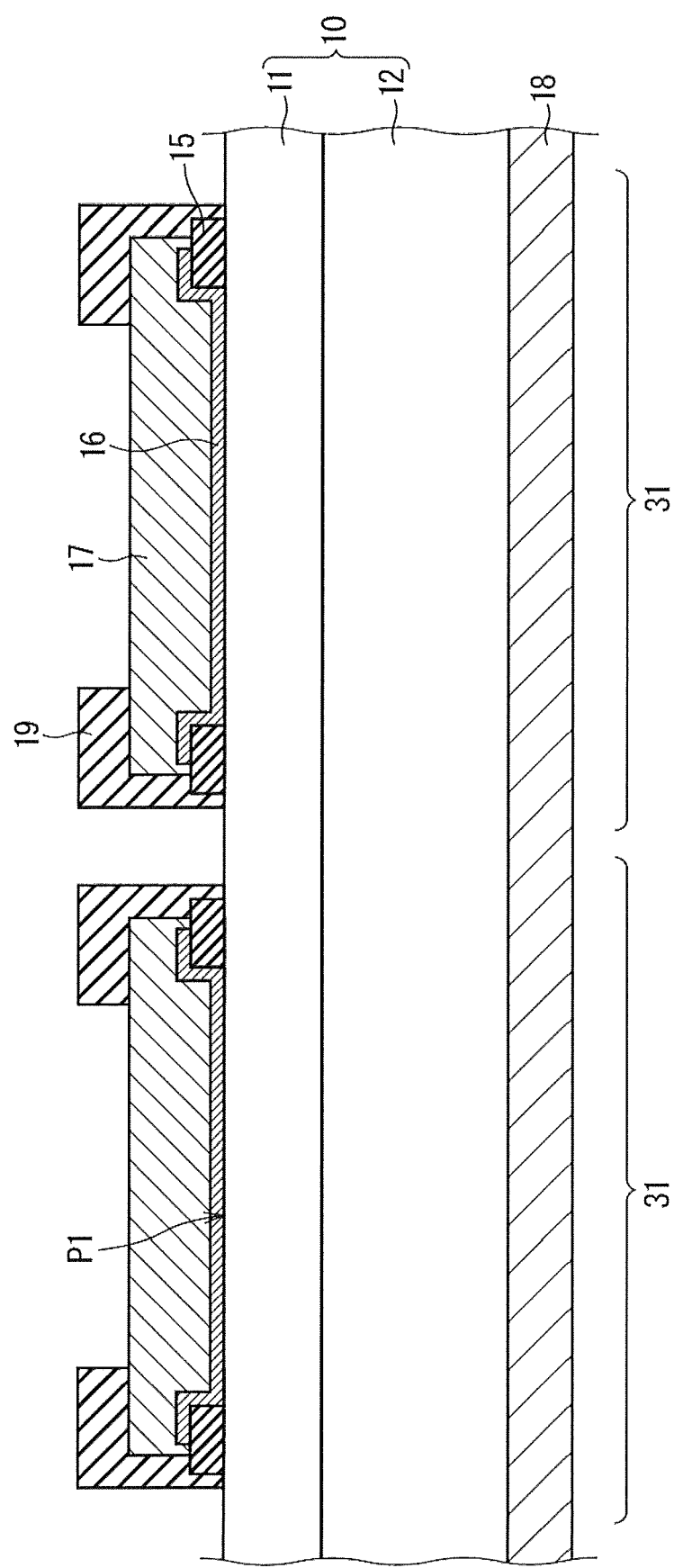
FIG. 11 is a partial sectional view taken along a line XI-XI in FIG. 12 and schematically illustrating a seventh step in the method for producing a silicon carbide semiconductor device according to Embodiment 1 of the present invention.
Figure 12:
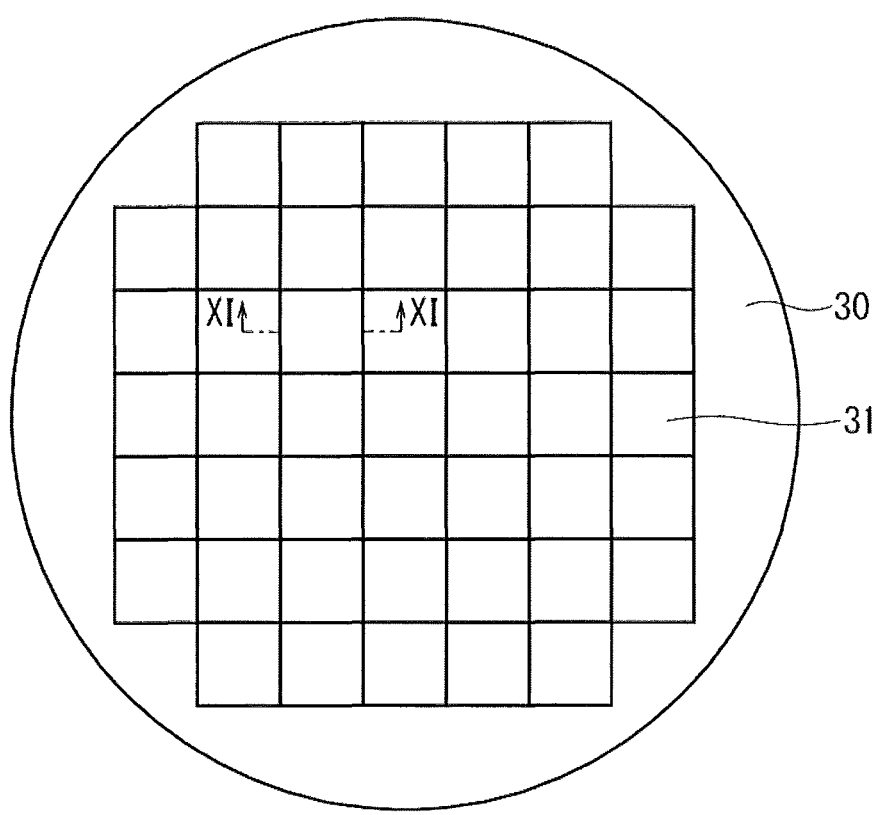
FIG. 12 is a plan view schematically illustrating the seventh step in the method for producing a silicon carbide semiconductor device according to Embodiment 1 of the present invention.

First, steps that are performed before dicing (so-called wafer-level steps), i.e., the first half of the production method, will be described. FIG. 4 is a plan view schematically illustrating a first step in the method for producing the SBD 91, and FIG. 5 is a partial sectional view taken along a line V-V (FIG. 4). FIGS. 6 to 10 are partial sectional views schematically illustrating second to sixth steps, respectively, in the method for producing the SBD 91. FIG. 11 is a partial sectional view taken along a line XI-XI (FIG. 12) and schematically illustrating a seventh step in the method for producing the SBD 91 according to Embodiment 1 of the present invention, and FIG. 12 is a plan view schematically illustrating this seventh step.

Referring to FIGS. 4 and 5, an epitaxial wafer 30 of an n-type is prepared. The epitaxial wafer 30 is larger than the SBD 91 (FIG. 1) in plan view, and in mass production, a plurality of SBDs 91 is ultimately cut out of the epitaxial wafer 30 by dicing. The epitaxial wafer 30 includes the drift layer 11 that has the face P1 and the face P2 opposite the face P1, and the SiC substrate 12 that has the face P3 facing the face P2 of the drift layer 11, and the face P4 opposite the face P3. The epitaxial wafer 30 is obtained by epitaxially growing the drift layer 11 on the face P3 of the SiC substrate 12 that is in the form of a wafer, i.e., before dicing. The epitaxial growth is typically performed by accumulating SiC while adding impurities as necessary.

Note that the drift layer 11 may be formed to have a multilayer structure by changing deposition conditions in the midstream of epitaxial growth. For example, a first drift region may be formed on the face P3 of the SiC substrate 12, and then a second drift region may be formed on this first drift region. For example, the first drift region is epitaxially grown at a first growth temperature, and then the second drift region is epitaxially grown at a second growth temperature lower than the first growth temperature.

Figure 6:
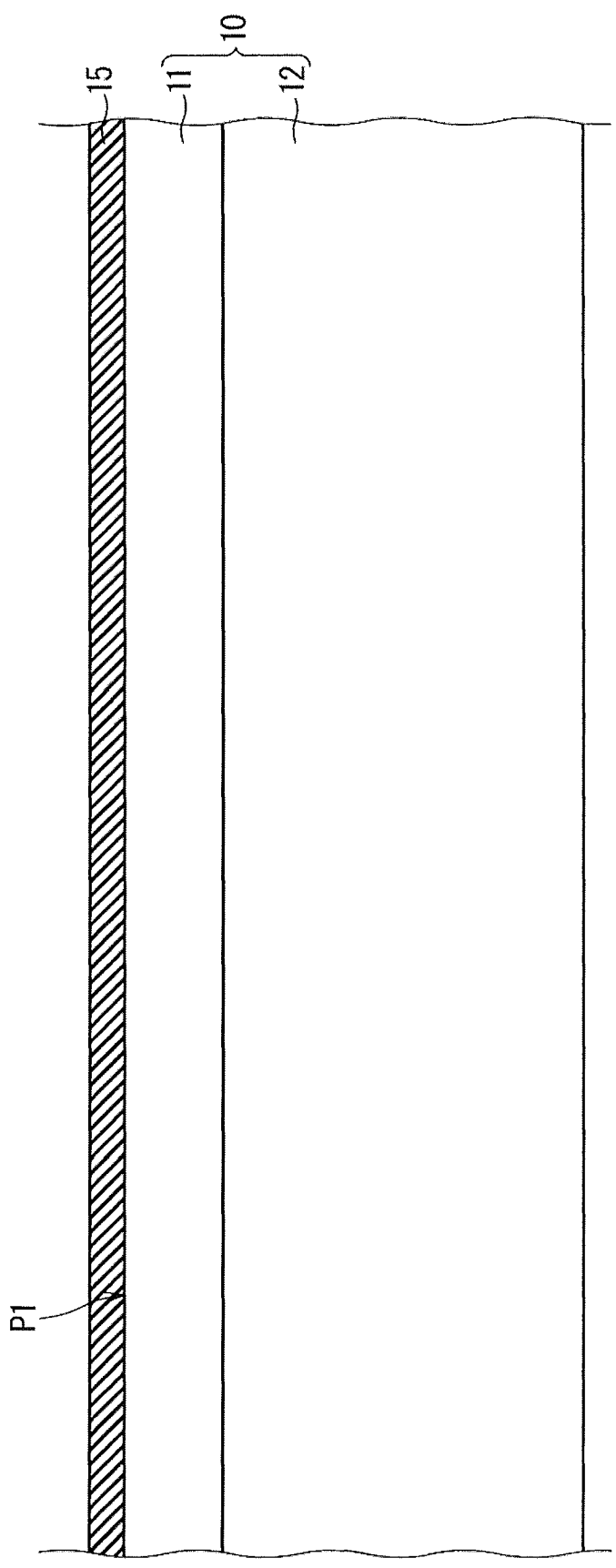
FIG. 6 is a partial sectional view schematically illustrating a second step in the method for producing a silicon carbide semiconductor device according to Embodiment 1 of the present invention.

Referring to FIG. 6, the interlayer insulating layer 15 is deposited on the face P1 of the drift layer 11. Examples of the deposition method include thermal oxidation methods and accumulation methods. One example of the accumulation methods is chemical vapor deposition (CND).

Figure 7:
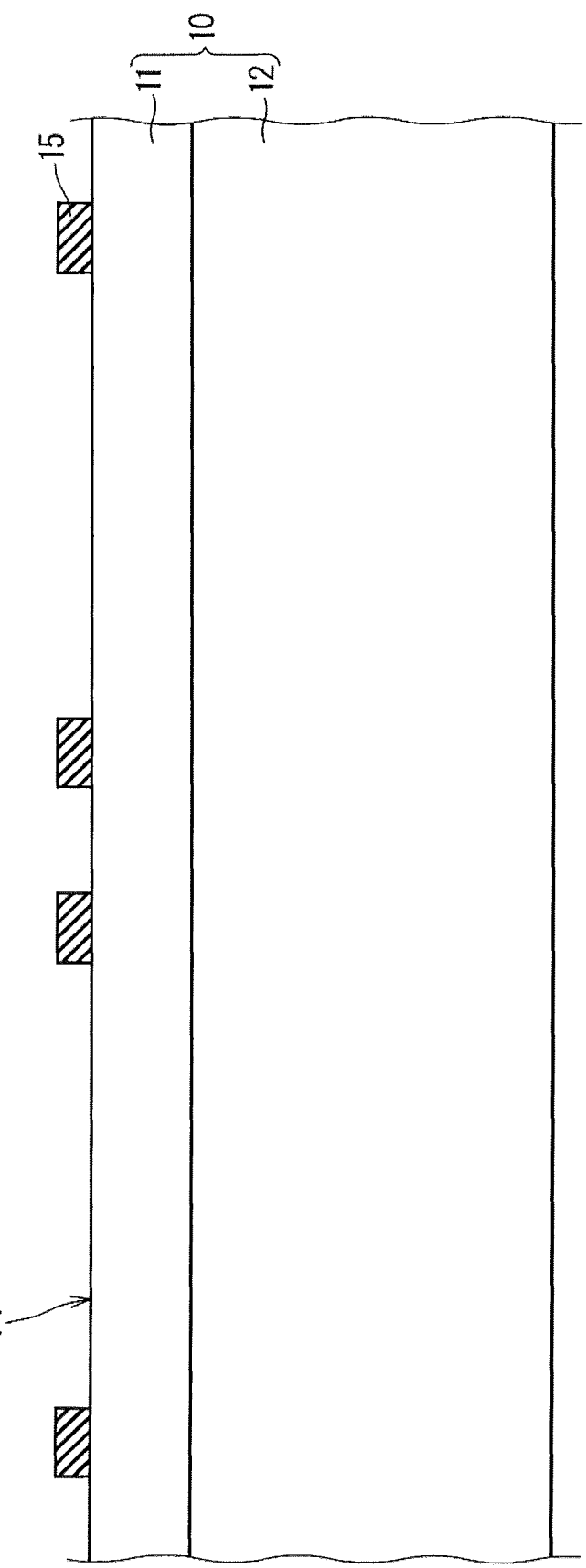
FIG. 7 is a partial sectional view schematically illustrating a third step in the method for producing a silicon carbide semiconductor device according to Embodiment 1 of the present invention.

Referring further to FIG. 7, a pattern is given to the interlayer insulating layer 15. This patterning is performed such that the interlayer insulating layer 15 is disposed around the Schottky electrode layer 16 at the time of completion of the SBD 91 (FIG. 2). Specifically, first, an etching mask (not shown) is formed of a resist or the like on the interlayer insulating layer 15 by a photomechanical process. Next, an unnecessary portion of the interlayer insulating layer 15 is removed by dry etching using plasma or wet etching using a chemical solution. Thereafter, the etching mask is removed by plasma ashing or wet processing. As a result, the structure illustrated in FIG. 7 is obtained.

Note that impurities may be added to the face P1 of the drift layer 11 before or after the formation of the interlayer insulating layer 15. For example, in order to improve the withstand voltage of the SBD 91, an impurity layer may be formed on a portion of the face P1 where the interlayer insulating layer 15 is disposed, by adding impurities. The impurities are added by, for example, ion implantation and activation. For example, boron (B) or aluminum (Al) is used as an acceptor impurity. As a donor impurity, phosphorus (P) or nitrogen (N) is used, for example.

Figure 8:
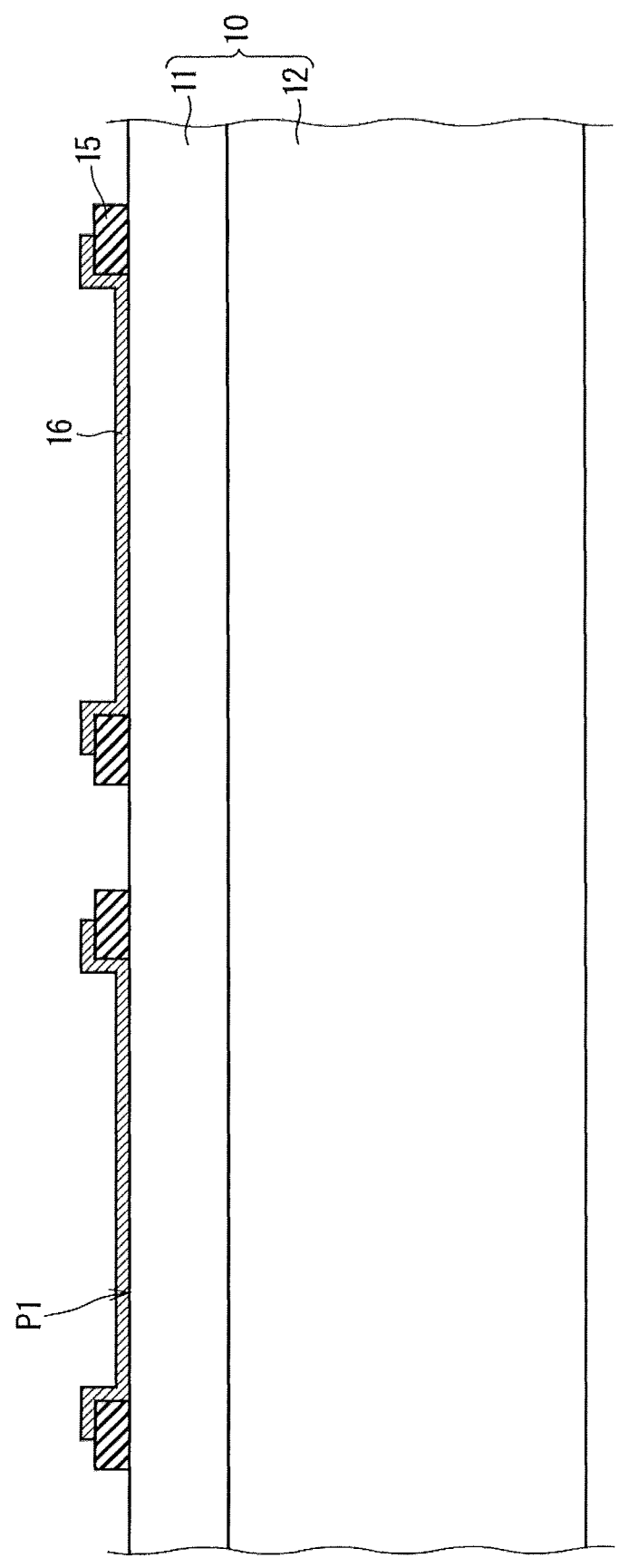
FIG. 8 is a partial sectional view schematically illustrating a fourth step in the method for producing a silicon carbide semiconductor device according to Embodiment 1 of the present invention.

Referring to FIG. 8, next, the Schottky electrode layer 16 is formed. Specifically, wet processing using hydrofluoric acid and cleaning processing are first performed as necessary on the face P1 where the Schottky electrode layer 16 is to be deposited. In the cleaning processing, a mixed solution of ammonia and a hydrogen peroxide solution, a mixed solution of sulfuric acid and a hydrogen peroxide solution, and a mixed solution of hydrochloric acid and a hydrogen peroxide solution are used, for example. Next, the Schottky electrode layer 16 is deposited. The material for the Schottky electrode layer can be selected appropriately from, for example, titanium (Ti), nickel (Ni), iridium (Ir), and platinum (Pt). Thereafter, a pattern is given to the Schottky electrode layer 16. This patterning is performed such that the Schottky electrode layer 16 forms an interface with part of the face P1. Specifically, an etching mask (not Shown) is first formed of a resist or the like on the Schottky electrode layer 16 by a photomechanical process. Next, an unnecessary portion of the Schottky electrode layer 16 is removed by, for example, dry etching using plasma or wet etching using a chemical solution. Thereafter, the etching mask is removed by, for example, plasma aching or wet processing. As a result, the structure illustrated in FIG. 8 is obtained. Note that heat treatment may be performed as necessary in order to make more secure the electrical connection between the Schottky electrode layer 16 and the drift layer 11.

Figure 9:
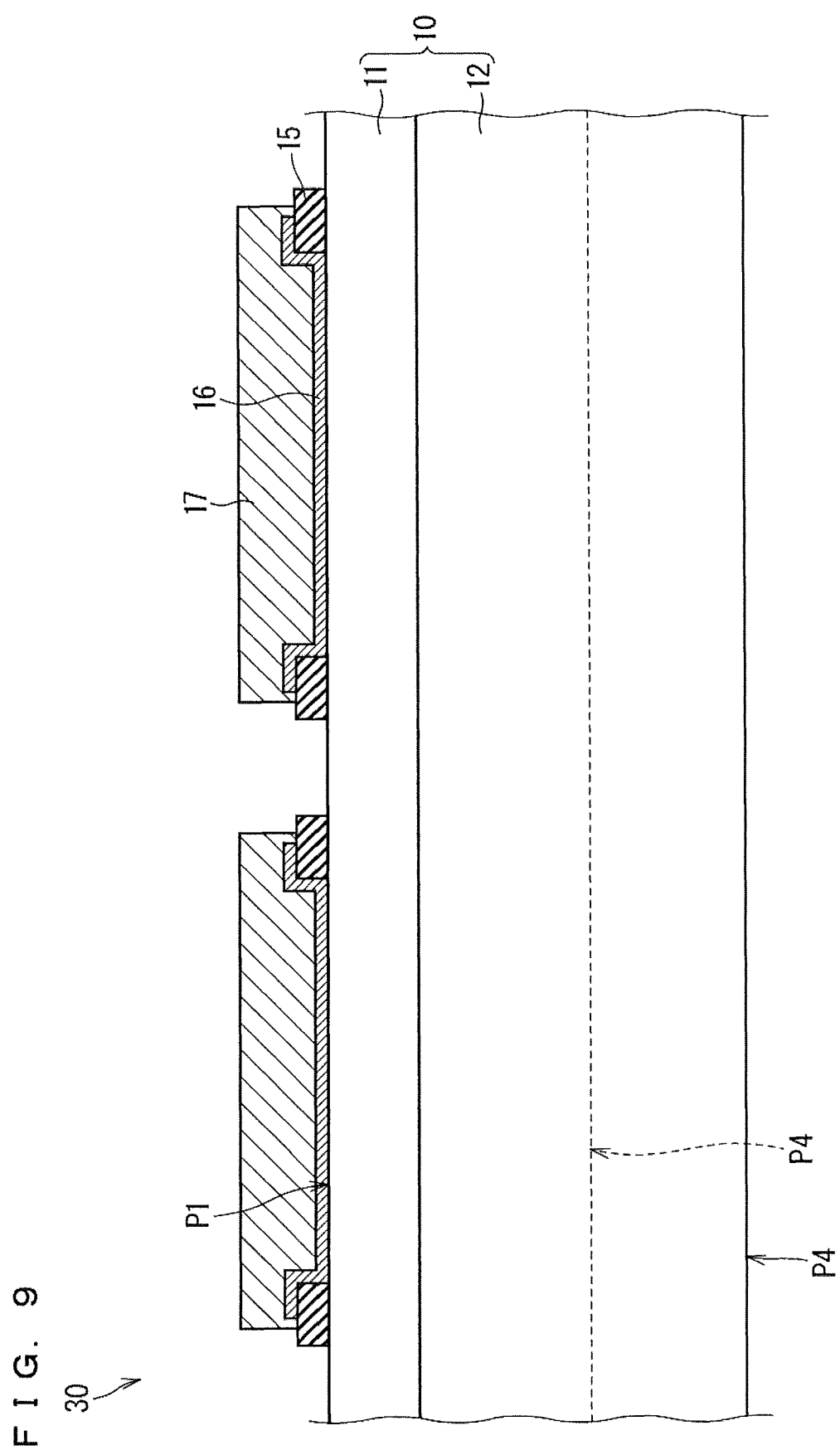
FIG. 9 is a partial sectional view schematically illustrating a fifth step in the method for producing a silicon carbide semiconductor device according to Embodiment 1 of the present invention.

Referring to FIG. 9, the frontside electrode layer 17 is formed on the Schottky electrode layer 16. Specifically, a film that makes the frontside electrode layer 17 is first formed by sputtering or vapor deposition. The material to be accumulated is, for example, an aluminum alloy containing aluminum and silicon, or nickel. Next, a pattern is given to this film. Specifically, an etching mask (not shown) is first formed of a resist or the like on this film by a photomechanical process. Next, an unnecessary portion of this film is removed by, for example, dry etching using plasma or wet etching using a chemical solution.

Thereafter, the thickness of the SiC substrate 12 may be reduced by performing processing on the face P4 of the SiC substrate 12 as indicated by a broken line in the drawing. For example, the face P4 is subjected to grinding using a whetstone configured by alumina or diamond abrasive grains.

Figure 10:
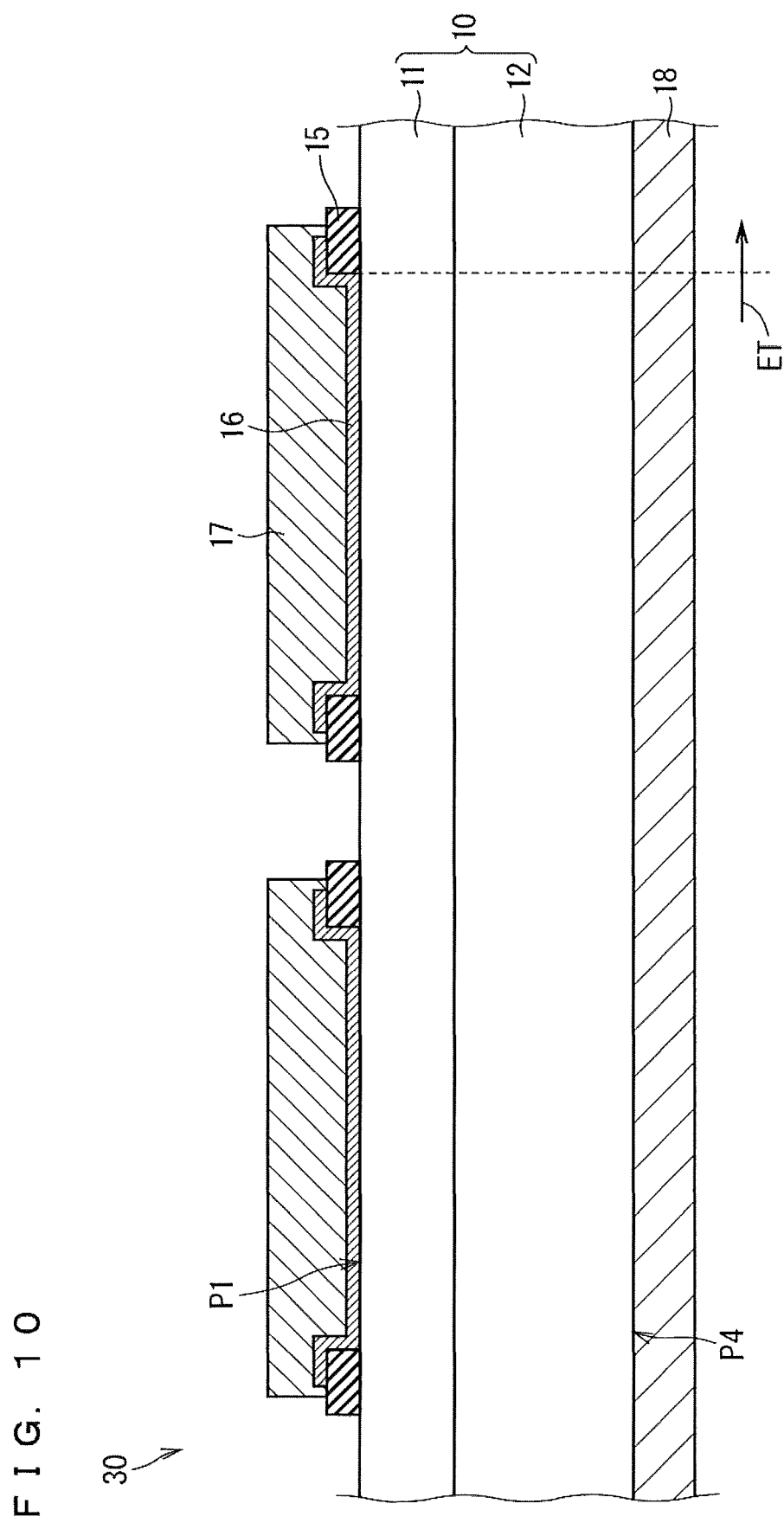
FIG. 10 is a partial sectional view schematically illustrating a sixth step in the method for producing a silicon carbide semiconductor device according to Embodiment 1 of the present invention.

Referring to FIG. 10, the backside electrode layer 18 is formed on the face P4 of the SiC substrate 12. For example, titanium, a titanium alloy, aluminum, an aluminum alloy containing silicon, or nickel is accumulated. Note that the backside electrode layer 18 may be formed to have a multilayer structure. For example, in order to prevent oxidation of an electrode material during soldering, an antioxidant film may be formed of, for example, gold, platinum, silver, or a silver alloy containing palladium on the outermost surface of the backside electrode layer 18.

The backside electrode layer 18 is formed extending outward of the interface between the face P1 of the drift layer 11 and the Schottky electrode layer 16 in the in-plane direction (lateral direction in the drawing) as indicated by an arrow ET in the drawing. This condition is typically satisfied by the absence of patterning after the deposition on the face P4 of the SiC substrate 12. The absence of patterning simplifies the production method. In this case, the backside electrode layer 18 is provided on the entire face P4 of the SBD 91 (FIG. 2).

Referring to FIG. 11, the passivation layer 19 is formed thereafter. Specifically, a film formed of, for example, SiN or polyimide is first deposited. Examples of the deposition method include CVD and coating methods using spin coating or inkjet coating. Next, a pattern is given to this film.

Referring further to FIG. 12, the epitaxial wafer 30 with semiconductor chips 31 formed thereon is prepared as described above. Each of the semiconductor chips 31 includes the epitaxial substrate 10, the Schottky electrode layer 16, the interlayer insulating layer 15, the backside electrode layer 18, the frontside electrode layer 17, and the passivation layer 19.

Second Half of Production Method

Figure 13:
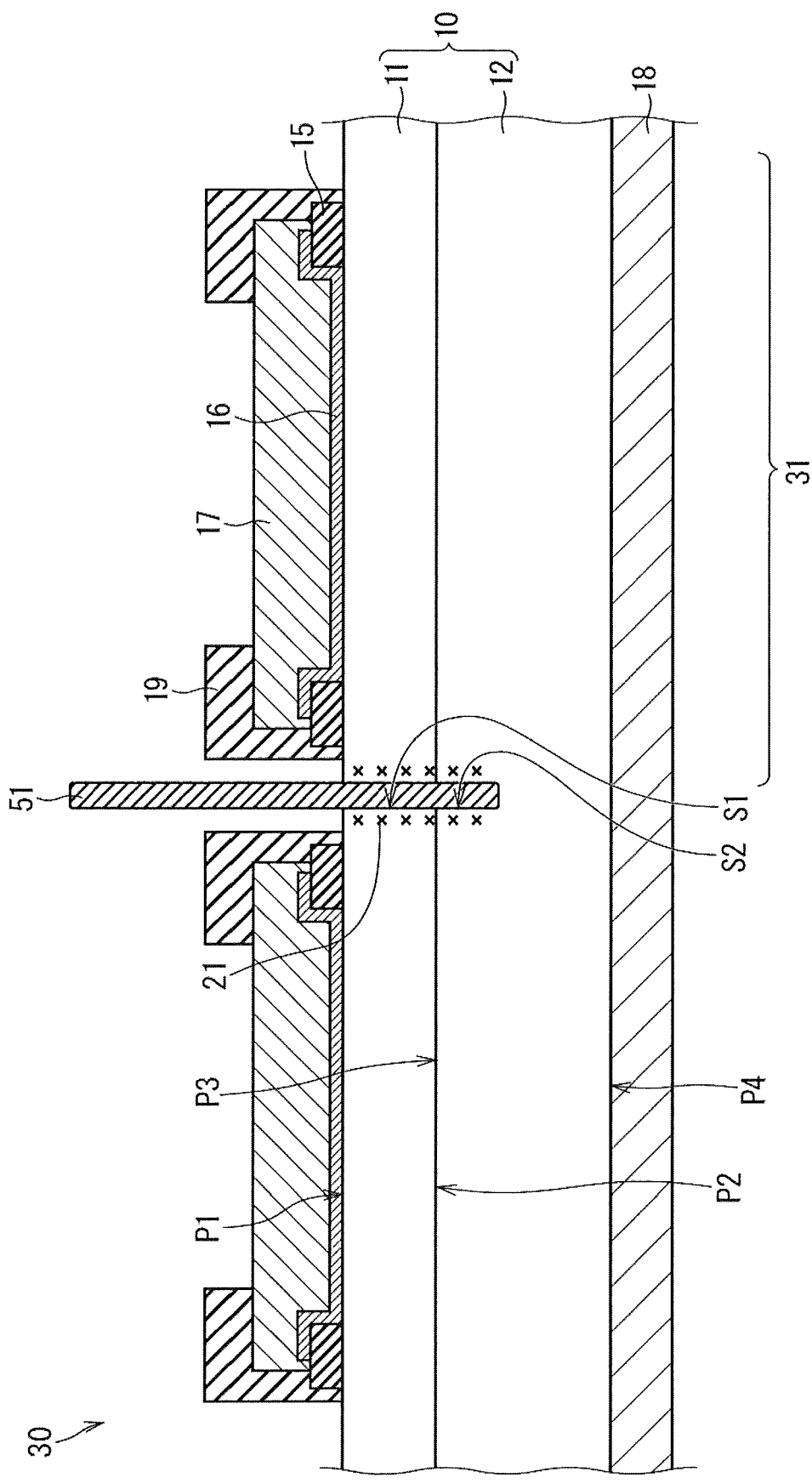
FIG. 13 is a partial sectional view schematically illustrating an eighth step in the method for producing a silicon carbide semiconductor device according to Embodiment 1 of the present invention.
Figure 14:
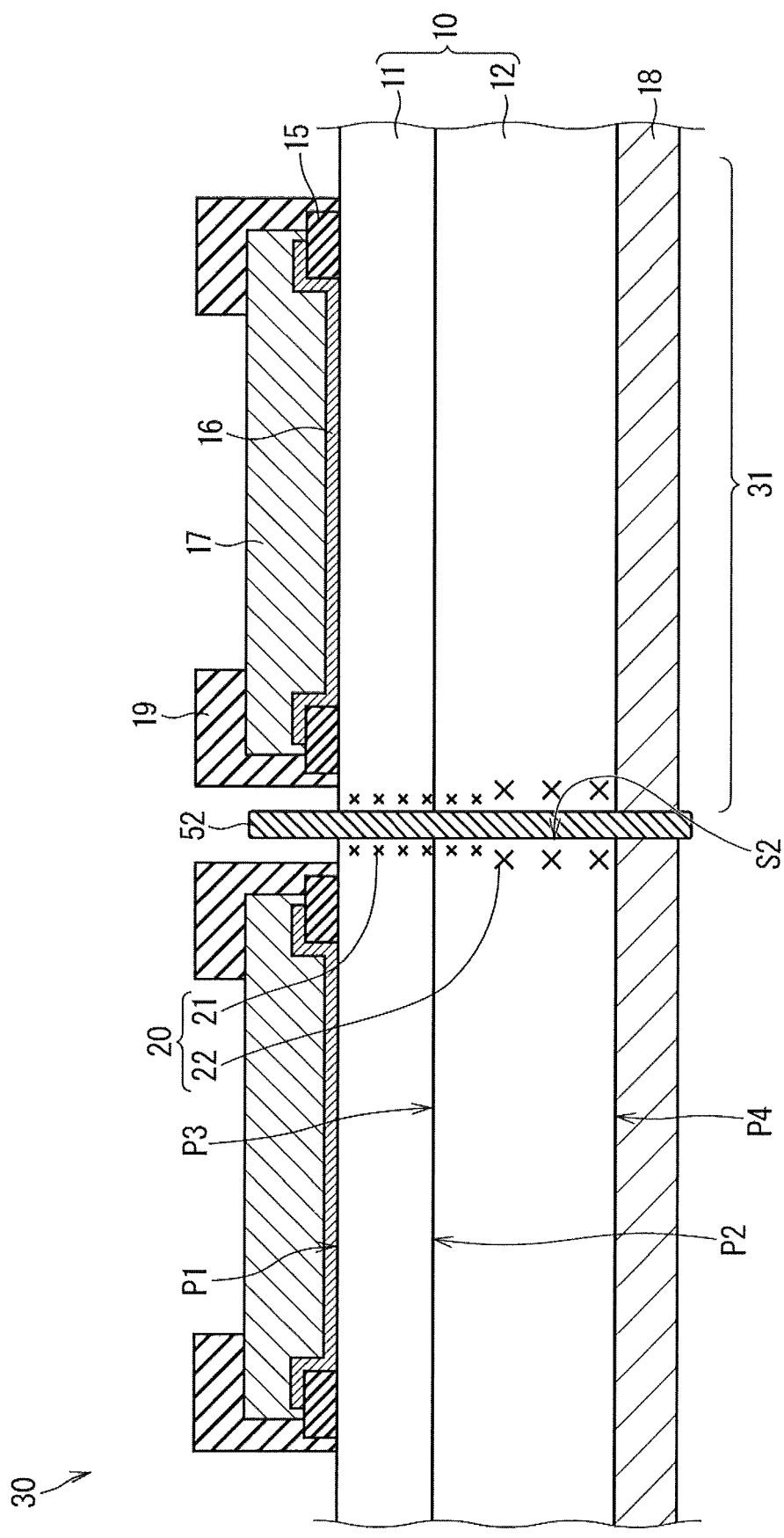
FIG. 14 is a partial sectional view schematically illustrating a ninth step in the method for producing a silicon carbide semiconductor device according to Embodiment 1 of the present invention.

Next, steps of dicing the epitaxial wafer 30 are performed as the second half of the production method. FIGS. 13 and 14 are partial sectional views schematically illustrating eighth and ninth steps, respectively, that are the second-half steps in the method for producing the SBD 91.

Referring to FIG. 13, first, at least part of the drift layer 11 is cut with a dicing blade 51 that has a first abrasive grain diameter as an average value. Thereby, at least part of the side face S1 of the drift layer 11 is formed. As a result of the dicing with the dicing blade 51, the first crush layer 21 is provided on this side face S1.

In particular, in the illustrated example, the drift layer 11 is cut completely, or in other words from the face P1 to the face P2, with the dicing blade 51. Thus, the side face S1 of the drift layer 11 is formed entirely. Furthermore, the SiC substrate 12 is cut partially from the face P3, and thereby the side face S2 is formed partially. As a result of the dicing with the dicing blade 51, the first crush layer 21 is also provided on this side face S2.

Referring to FIG. 14, at least part of the SiC substrate 12 is cut with a dicing blade 52 that has a second abrasive grain diameter as an average value. Thereby, at least part of the side face S2 of the SiC substrate 12 is formed. As a result of the dicing with the dicing blade 52, the second crush layer 22 is provided on this side face S2.

In particular, in the illustrated example, the SiC substrate 12 is cut from the lowest position of the partially formed side face S2 (FIG. 13) to the face P4 with the dicing blade 52. Thereby, the other portion of the side face S2 of the SiC substrate 12 is formed, and as a result of the dicing with the dicing blade 52, the second crush layer 22 is provided on this portion.

Through the dicing steps described above, the epitaxial wafer 30 is diced. That is, the crush layer 20 is formed on the side face S1 of the drift layer 11 and on the side face S2 of the SiC substrate 12. These dicing steps are performed such that the thickness of the second crush layer 22 becomes greater than the thickness of the first crush layer 21. As a result, the thickness of the crush layer 20 on the side face 52 is greater than that of the crush layer 20 on the side face S1. In order to satisfy this condition, for example, the second abrasive grain diameter may be made greater than the first abrasive grain diameter. The second abrasive gain diameter is preferably greater than or equal to 3 μm.

The epitaxial wafer 30 is thereby diced, and as a result, the semiconductor chips 31 are cut out. In other words, the semiconductor chips 31 are cut into individual pieces. Thereby, the SBD 91 (FIG. 2) is obtained.

Switching from the dicing blade 51 to the dicing blade 52 is preferably performed after the completion of cutting of the drift layer 11 as illustrated in FIG. 13. Although, in the above-described production method, the direction in which the dicing is performed is from the face P1 to the face P4, the dicing may be performed in the reverse direction from the face P4 to the face P1. In that case, after the dicing with the dicing blade 52 (FIG. 14) is performed, the dicing with the dicing blade 51 (FIG. 13) is performed. In this case, switching from the dicing blade 52 to the dicing blade 51 is preferably performed either before or at the same time as the completion of cutting of the SIC substrate 12 with the dicing blade 52.

The dicing steps can use, for example, a dicing saw DFD6450 produced by DISCO Corporation or a dicing machine AS3000T/S produced by Tokyo Scimitsu Co., Ltd. As the dicing blades, those that contain diamond abrasive grains can be used. Control conditions for the blades are, for example, that the number of revolutions is in the range of 10000 rpm to 30000 rpm, and the feed speed is in the range of 5 mm/sec to 100 mm/sec. Optimum control conditions may be optimized according to the blade material and a dicing device on which the blade material is mounted.

Although a case where the epitaxial substrate 10 is of an n type has been described in detail above, the epitaxial substrate 10 may be of a p-type.

Comparative Example

Figure 15:
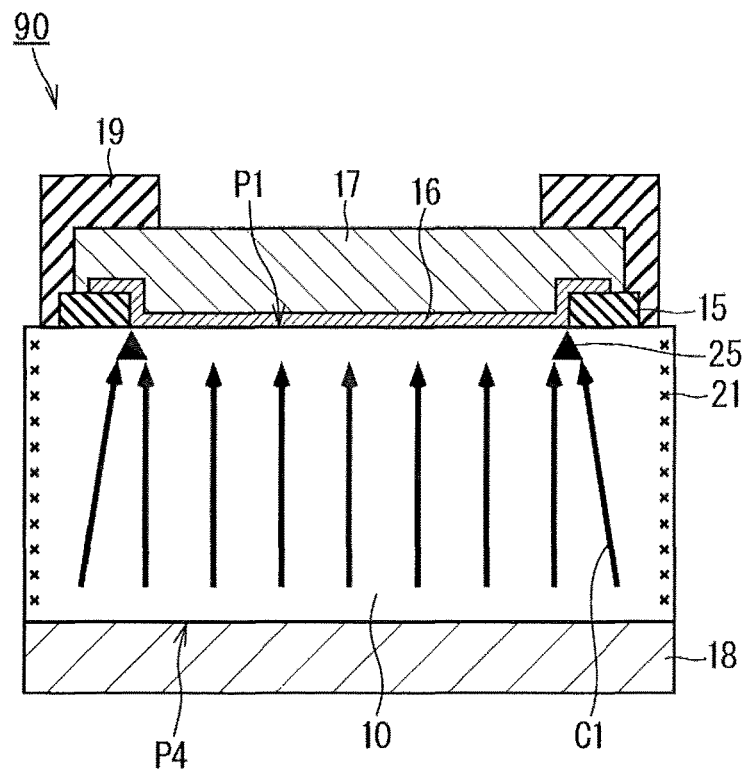
FIG. 15 is a sectional view schematically illustrating a flow of current in a silicon carbide semiconductor device according to a comparative example.
Figure 16:
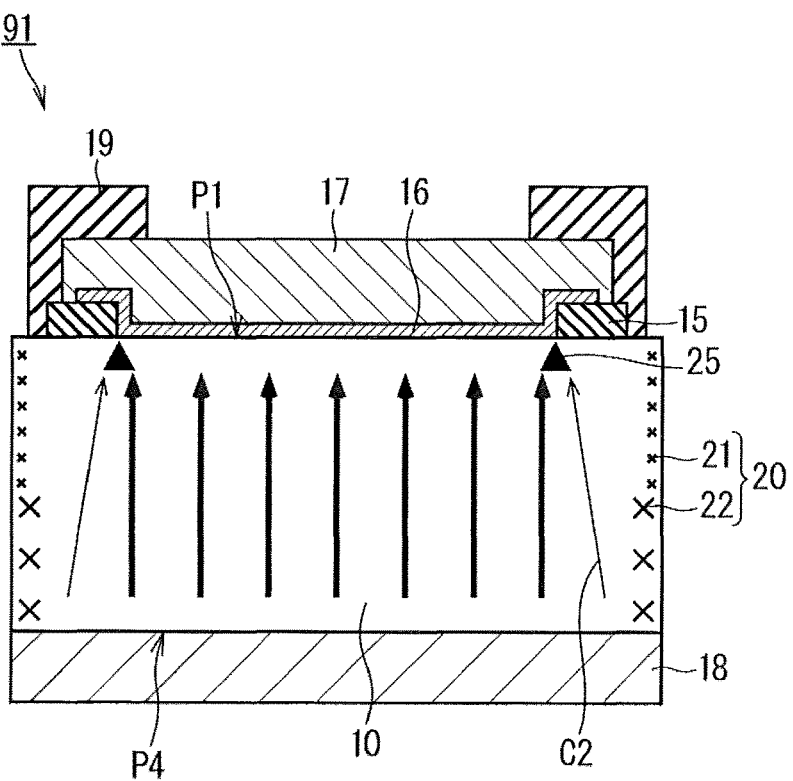
FIG. 16 is a sectional view schematically illustrating a flow of current in the silicon carbide semiconductor device in FIG. 2.

FIGS. 15 and 16 are sectional views schematically illustrating flows of current in an SBD 90 according to a comparative example and in the SBD 91 according to the present embodiment, respectively. Unlike the SBD 91 according to the present embodiment, the SBD 90 according to the comparative example is not provided with the relatively thick second crush layer 22, but is provided with the relatively thin first crush layer 21 on the entire side face of the epitaxial substrate 10.

In the SBD 90 according to the comparative example, current C1 that flows from the outer peripheral portion of the backside electrode layer 18 toward the Schottky electrode layer 16 is likely to be concentrated on current concentration points 25. Here, the current concentration points 25 correspond to the outer edges of the interface between the Schottky electrode layer 16 and the face P1 of the epitaxial substrate 10. In contrast, in the SBD 91, the relatively thick second crush layer 22 is provided in the vicinity of the outer peripheral portion of the backside electrode layer 18. Thus, current C2 that flows from the outer peripheral portion of the backside electrode layer 18 toward the Schottky electrode layer 16 decreases significantly. This moderates the current concentration on the current concentration points 25. A conceivable reason why the current C2 decreases significantly is that a large number of crystal defects are formed in the epitaxial substrate 10 due to the presence of the thick second crush layer 22, and a large number of carriers are trapped by this large number of crystal defects. On the other hand, in the SBD 90 that includes only the thin first crush layer 21 according to the comparative example, the current C1 does not decrease significantly, and therefore current concentration becomes noticeable.

If the first crush layer 21 (FIG. 16) has a too great thickness (lateral dimension in the drawing) and extends beyond the current concentration points 25, even a normal flow of current in the SBD 91 is inhibited, and as a result, the electric resistance of the SBD 91 will increase unnecessarily. Thus, the thickness of the first crush layer 21 is preferably less than or equal to a distance from the edge of the epitaxial substrate 10 to the current concentration points 25. This distance is typically less than or equal to 500 μm in SiC semiconductor devices that aim at downsizing.

Experiments

SBD samples were produced and evaluated. A plurality of samples was produced by changing the first abrasive grain diameter of the dicing blade 51 (FIG. 13) or the second abrasive grain diameter of the dicing blade 52 (FIG. 14). Also, a sample that employed cleavage instead of cutting with dicing blades was produced. In graphical diagrams described later, for convenience of plotting the graphs, results on the sample employing cleavage are shown as corresponding to results for the case where the abrasive grain diameter is 0 μm.

Figure 17:
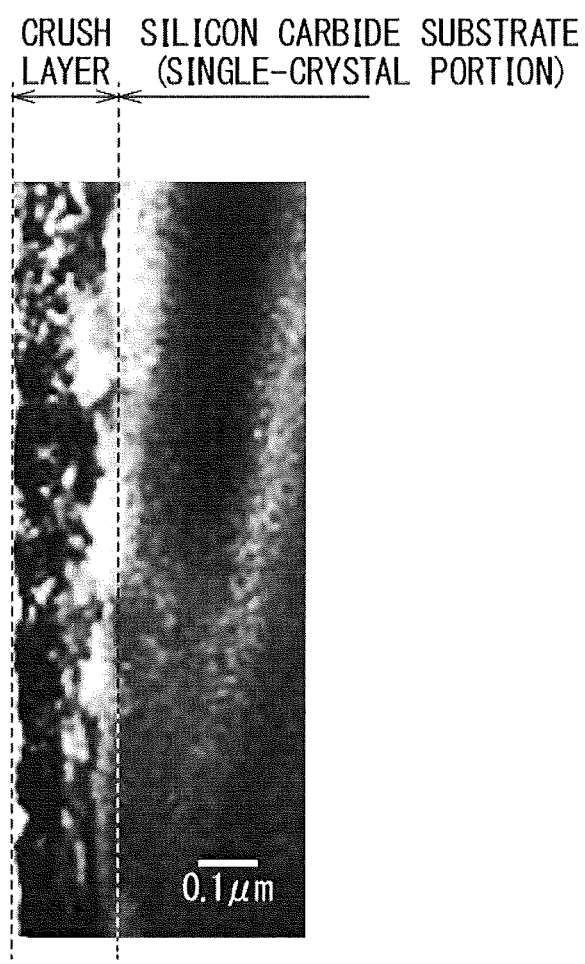
FIG. 17 is a transmission electron microscope (TEM) photograph of a silicon carbide substrate and a crush layer provided on the side face of the silicon carbide substrate.

FIG. 17 is a transmission electron microscope (TEM) photograph of the SiC substrate 12 and the crush layer 20 provided on the side face 52 of the SiC substrate 12. In the drawing, a homogeneous region on the right side is a single-crystal portion. A region on the left side, adjacent to this single-crystal portion, is an amorphous or polycrystalline portion and corresponds to the crush layer 20. The thickness of the crush layer 20 is measured as the thickness of this region (lateral dimension in the drawing).

Figure 18:
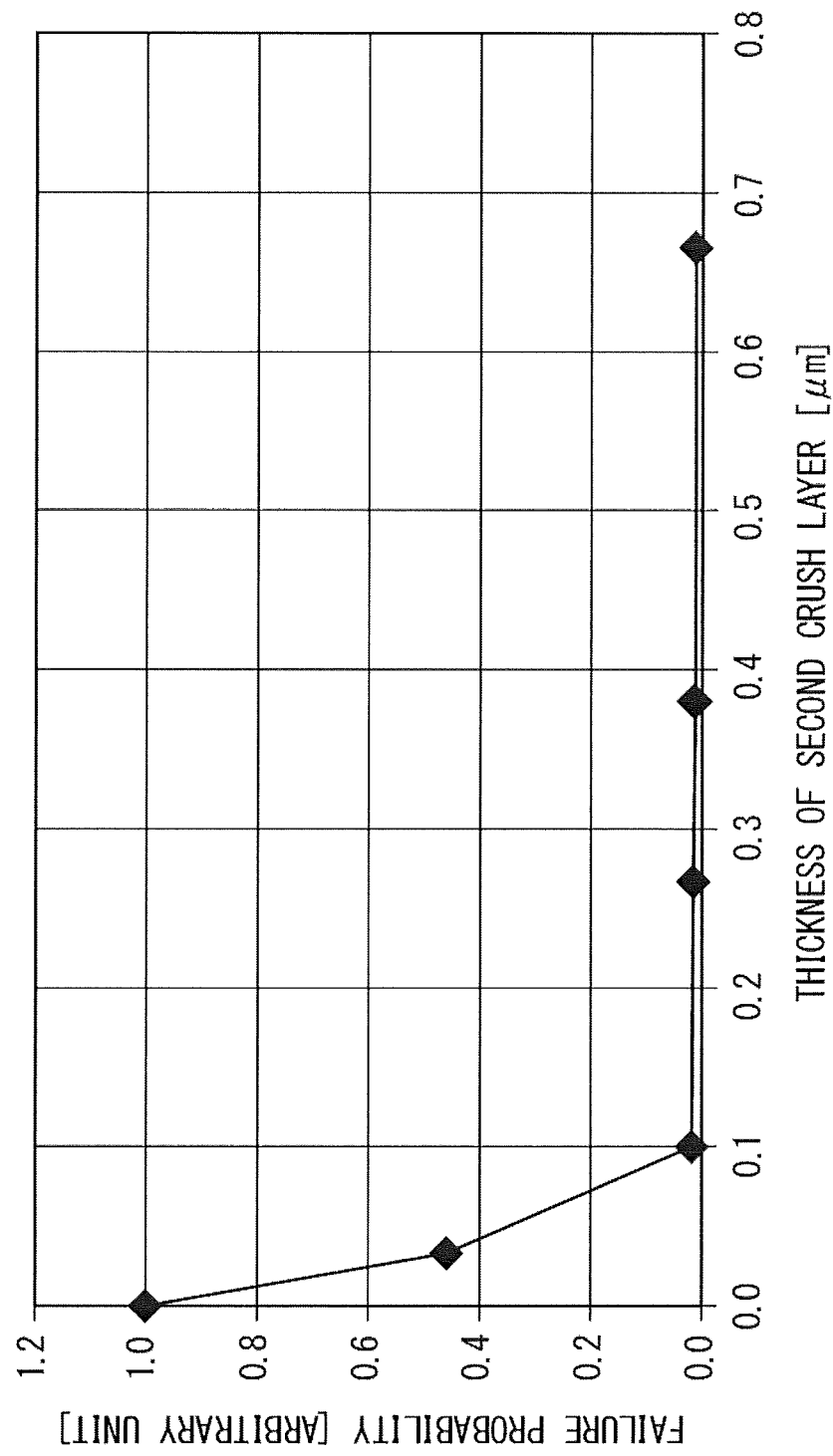
FIG. 18 is a graphical diagram illustrating an exemplary relationship between the thickness of a second crush layer and the failure probability of the silicon carbide semiconductor device.
Figure 19:
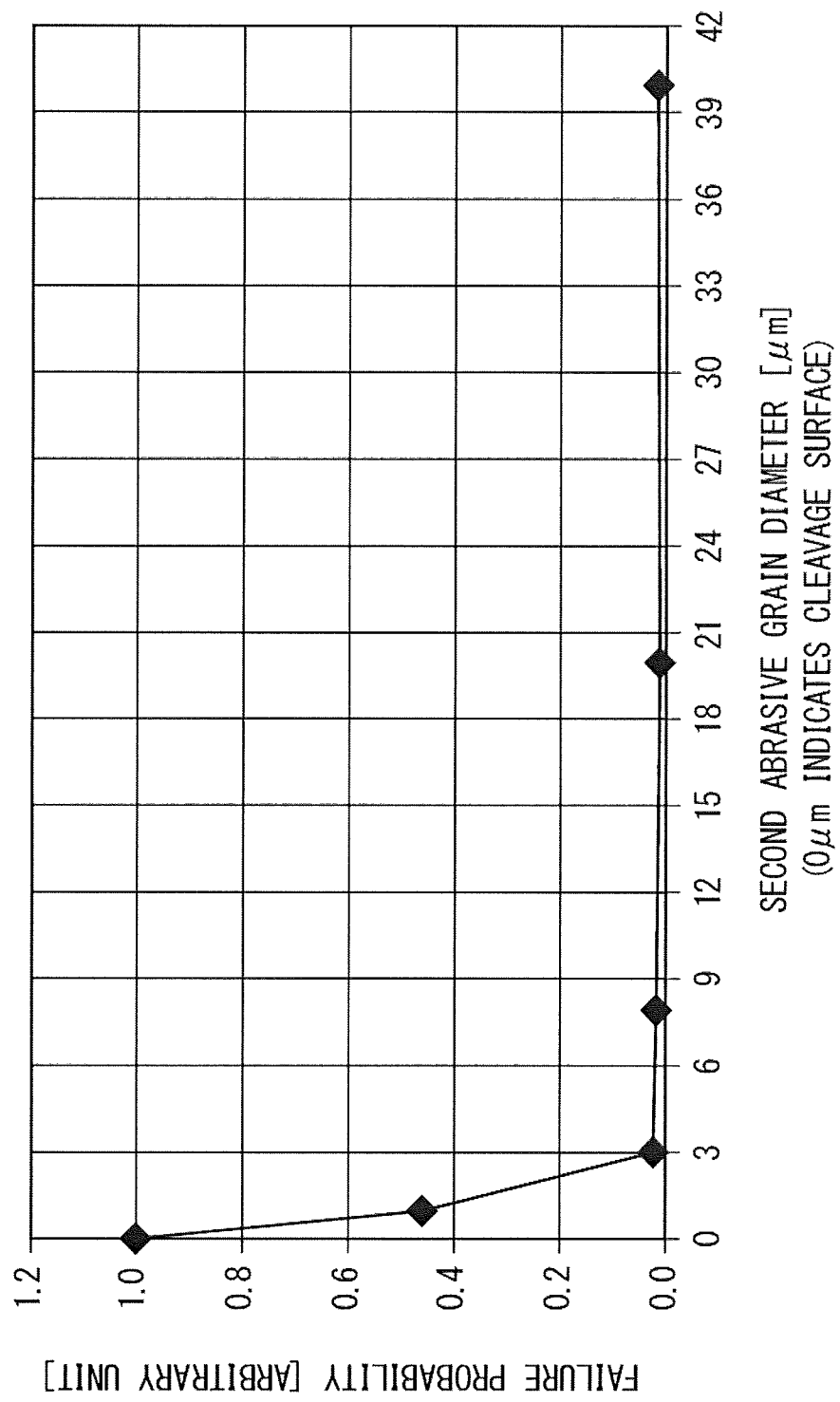
FIG. 19 is a graphical diagram illustrating art exemplary relationship between a second abrasive grain diameter and the failure probability of the silicon carbide semiconductor device.
Figure 20:
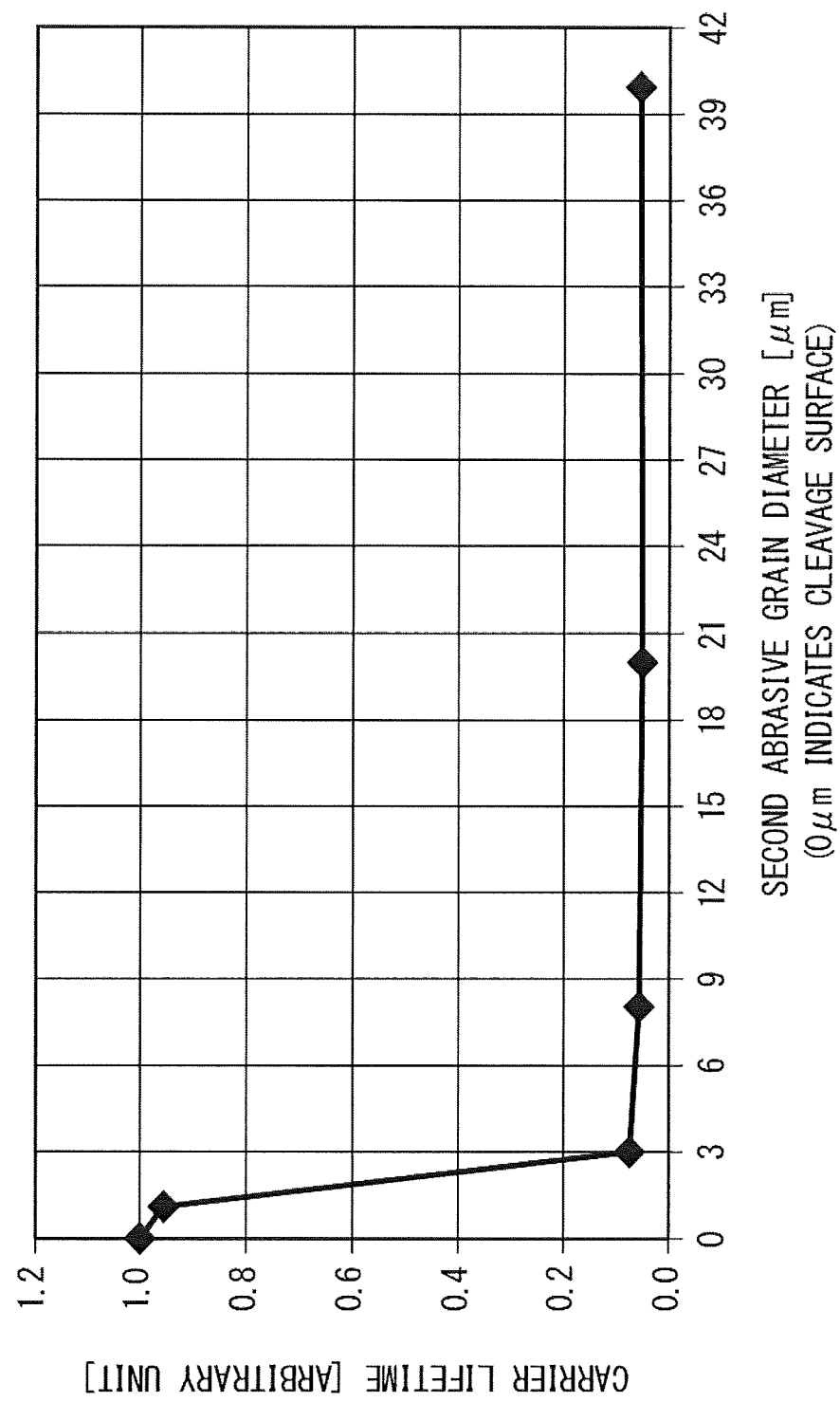
FIG. 20 is a graphical diagram illustrating an exemplary relationship between the second abrasive grain diameter and a carrier lifetime.

FIG. 18 is a graphical diagram illustrating an exemplary relationship between the thickness of the second crush layer 22 and the failure probability of the SBD during energization. The failure probability decreases remarkably in cases where the thickness of the second crush layer 22 is greater than or equal to 0.1 μm. FIG. 19 is a graphical diagram illustrating an exemplary relationship between the second abrasive grain diameter and the failure probability of the SBD 91. The failure probability decreases remarkably in cases where the second abrasive grain diameter is greater than or equal to 3 μm. FIG. 20 is a graphical diagram illustrating an exemplary relationship between the second abrasive grain diameter and a carrier lifetime. Here, the "carrier lifetime" refers to the amount of time required for electrons or holes in the substrate to be recombined, and reflects defects in the substrate. Measurement was performed by a μ-PCD method using LTA-1610SP produced by Kobeleo Research Institute, Inc. The carrier lifetime decreases remarkably in cases where the second abrasive grain diameter is greater than or equal to 3 μm.

FIG. 21 is a graphical diagram illustrating an exemplary relationship between the first abrasive grain diameter and a chip cracking percentage during dicing in cases where the epitaxial substrate 10 is diced halfway as illustrated in FIG. 13, using the first abrasive grain diameter. The chip cracking percentage in the dicing step (FIG. 13) increases remarkably in cases where the first abrasive grain diameter exceeds 100 μm. If the dicing using the first abrasive grain diameter is not on its halfway but has been fully completed in the thickness direction (longitudinal direction in FIG. 13), the value of the first abrasive grain diameter from which the chip cracking percentage will increase suddenly is presumed to be reduced from approximately 100 μm to a smaller value (e.g., approximately several micrometers) as indicated by a broken-line arrow in FIG. 21. A conceivable reason for this is that if a dicing blade with a small abrasive grain diameter is used to cut the backside electrode layer 18, the blade will be clogged with the electrode material for the backside electrode layer 18. Thus, in the case where the dicing in the thickness direction is fully performed while keeping constant the conditions for abrasive grain diameters, it is difficult to select the abrasive grain diameter in order to enable suppressing the failure probability (FIG. 19) while suppressing the chip cracking percentage (FIG. 21). In contrast, in the case where the dicing step using the first abrasive grain diameter and the dicing step using the second abrasive grain diameter greater than the first abrasive grain diameter are combined as in the present embodiment, it is possible to suppress the failure probability (FIG. 19) while suppressing the chip cracking percentage (FIG. 21).

In the experiments of the present embodiment, electro-cast blades were used as the dicing blades. Also, control conditions for the dicing blades were that the number of blade revolutions is 20000 rpm, and the feed speed is 20 mm/sec. The thickness of the silicon carbide substrate was set to 48 μm. The drift layer was set to have a layered structure of a first drift region with a thickness of 2 μm and a second drift region with a thickness of 10 μm. The height dimension h1 (FIG. 3) of the first crush layer 21 and the height dimension h2 (FIG. 3) of the second crush layer 22 were each set to 30 μm.

Summary of Effects

In the case where the backside electrode layer 18 is provided with a portion that extends outward of the interface between the face P1 of the drift layer 11 and the Schottky electrode layer 16 in the in-plane direction as indicated by the arrow ET (FIG. 2), current that flows from that portion of the backside electrode layer 18 (portion on the outside of the broken line in FIG. 2) toward the Schottky electrode layer 16 through the vicinity of the side face S2 of the SiC substrate 12 is likely to be concentrated on the outer edges (current concentration points 25 in FIG. 16) of the interface between the Schottky electrode layer 16 and the drift layer 11. According to the present embodiment, this current is at least partially trapped in the crush layer 20 provided on the side face S2 when passing through the vicinity of the side face S2 of the SiC substrate 12. This moderates the above-described current concentration. How much current is trapped depends on the thickness of the crush layer 20 on the side face S2. Thus, if the thickness of the crush layer 20 on the side face S2 is great enough, it is possible to sufficiently suppress the occurrence of dielectric breakdowns caused by current concentration. On the other hand, if the crush layer on the side face S1 has an excessively great thickness, cracking will easily occur in the SBD 91 due to external influences, particularly stress. According to the present embodiment, the thickness of the crush layer 20 on the side face S2 is greater than that of the crush layer 20 on the side face S1. Thus, it is possible to suppress the occurrence of dielectric breakdowns caused by local current concentration on the drift layer 11 during energization or switching, while suppressing the occurrence of cracking in the SBD 91.

Preferably, the thickness (thickness d2 in FIG. 3) of the crush layer 20 on the side face S2 is greater than or equal to 0.1 μm. With this thickness, current is more sufficiently trapped in the vicinity of the side face S2 of the SiC substrate 12. Accordingly, the occurrence of dielectric breakdowns caused by local current concentration on the drift layer 11 can be suppressed more sufficiently.

In the method for producing the SBD 91 according to the present embodiment, the SBD 91 can be obtained by cutting out semiconductor chips 31 (FIG. 12) formed on the epitaxial wafer 30. The crush layer 20 is formed by dicing (FIGS. 13 and 14) performed for this cutout. Thus, there is no need to perform another step to form the crush layer 20.

Preferably, in order to form the side face S1, the drift layer 11 is cut with the dicing blade 51 (FIG. 13) having the first abrasive grain diameter, and in order to at least partially form the side face S2, the SiC substrate 12 is cut with the dicing blade 52 (FIG. 14) having the second abrasive grain diameter greater than the first abrasive grain diameter. This makes the thickness of the crush layer 20 on the side face S2 greater than that of the crush layer 20 on the side face S1.

Preferably, the second abrasive grain diameter of the dicing blade 52 (FIG. 14) is greater than or equal to 3 μm. This allows the second crush layer 22 with a sufficiently great thickness to be formed more reliably. For example, in the experiments illustrated in FIGS. 18 and 19, the second abrasive grain diameter was set to be greater than or equal to 3 µm to form the second crush layer 22 with a thickness greater than or equal to 0.1 µm.

Suppression of Mechanical Breakdowns of SBD

While the above description mainly focuses on the effect of suppressing dielectric breakdowns, i.e., electrical breakdowns, the present embodiment is also useful in suppressing mechanical breakdowns. The details of this will be described hereinafter.

According to the technique disclosed in Japanese Patent Application Laid-Open No. 2014-11342, the insulation film provided on the outer peripheral portion of the n⁻-type drift layer has a groove as described previously. This groove hampers extension of cracks that can be generated during dicing. With this structure, it is highly possible to suppress mechanical breakdowns of the SBD to some extent. However, this structure requires a region for disposing a groove in the insulation film. If this groove is provided in the interlayer insulating layer 15 of the SBD 90 (FIG. 15) according to the comparative example, it becomes difficult to limit the distance between the outer edges of the epitaxial substrate 10 and the current concentration points 25 to a small distance, e.g., a distance less than or equal to 500 µm. As a result, the SBD 90 increases in size.

According to the present embodiment, mechanical breakdowns can be suppressed, almost irrespective of the size of the SBD). Specifically, according to the present embodiment, the thickness d1 (FIG. 3) of the first crush layer 21 provided on the side face S1 of the drift layer 11 is set to be smaller than the thickness d2 (FIG. 3) of the second crush layer 22. This suppresses a reduction in mechanical strength, caused by the presence of the crush layer. Preferably, the first crush layer 21 (FIG. 2) reaches the edge of the face P1 of the drift layer 11. This allows the thickness of the crush layer 20 at the edge of the face P1 to be smaller than that in the case where the second crush layer 22 reaches the edge of the face P1. Accordingly, it is possible to further suppress mechanical breakdowns, particularly chipping, caused b the crush layer 20 at the edge of the face P1.

As the thickness (longitudinal dimension in FIG. 2) of the epitaxial substrate 10 decreases, mechanical breakdowns are likely to become of particular concern. From the viewpoint of the withstand voltage, SiC that is a material having a high dielectric voltage can reduce the thickness of the epitaxial substrate 10. In that case, the mechanical strength decreases, and therefore it is critical to suppress mechanical breakdowns. According to the present embodiment, mechanical breakdowns can be suppressed as described above.

In the present embodiment, even if the film thickness is reduced to 100 µm or less, e.g., approximately 50 µm, chip cracking can be suppressed to a sufficient level in practice, in combination with the fact that SiC is used as a semiconducting material. In the case where other semiconducting materials (e.g., InP and GaAs) are used, cracking is likely to occur due to weak bonding of semiconductor crystals. Thus, it is common to use a considerably great thickness, but in that case, the aforementioned effect of the present embodiment is difficult to achieve.

Note that if cleavage is employed instead of using dicing blades as in the aforementioned technique disclosed in Japanese Patent Application Laid-Open No. 2015-146406, it is possible to suppress mechanical breakdowns such as cracking or chipping. However, in that case, current concentration caused by the current C1 (FIG. 15) becomes noticeable, and thereby dielectric breakdowns are likely to occur. According to the present embodiment, it is possible to suppress both mechanical breakdowns and dielectric breakdowns.

Embodiment 2

Configuration

FIG. 22 is a plan view schematically illustrating a configuration of an SBD 92 (silicon carbide semiconductor device) according to Embodiment 2 of the present invention. In the SBD 92, at least part of the side face S2 of the SiC substrate 12 protrudes out in the in-plane direction (lateral direction in the drawing) farther than the side face S1 of the drift layer 11. Specifically, the side face S2 includes a portion S2a that extends continuously from the side face S1 of the drift layer 11 in the longitudinal direction in the drawing, and a portion S2b that protrudes in stepwise form in the lateral direction in the drawing with reference to the side face S1 and the portion S2a. The first crush layer 21 is provided on the side face S1 and on the portion S2a of the side face S2. The second crush layer 22 is provided on the portion S2b of the side face S2.

Production Method

A Method for Producing the SBD 92 will be Described hereinafter.

Figure 23:
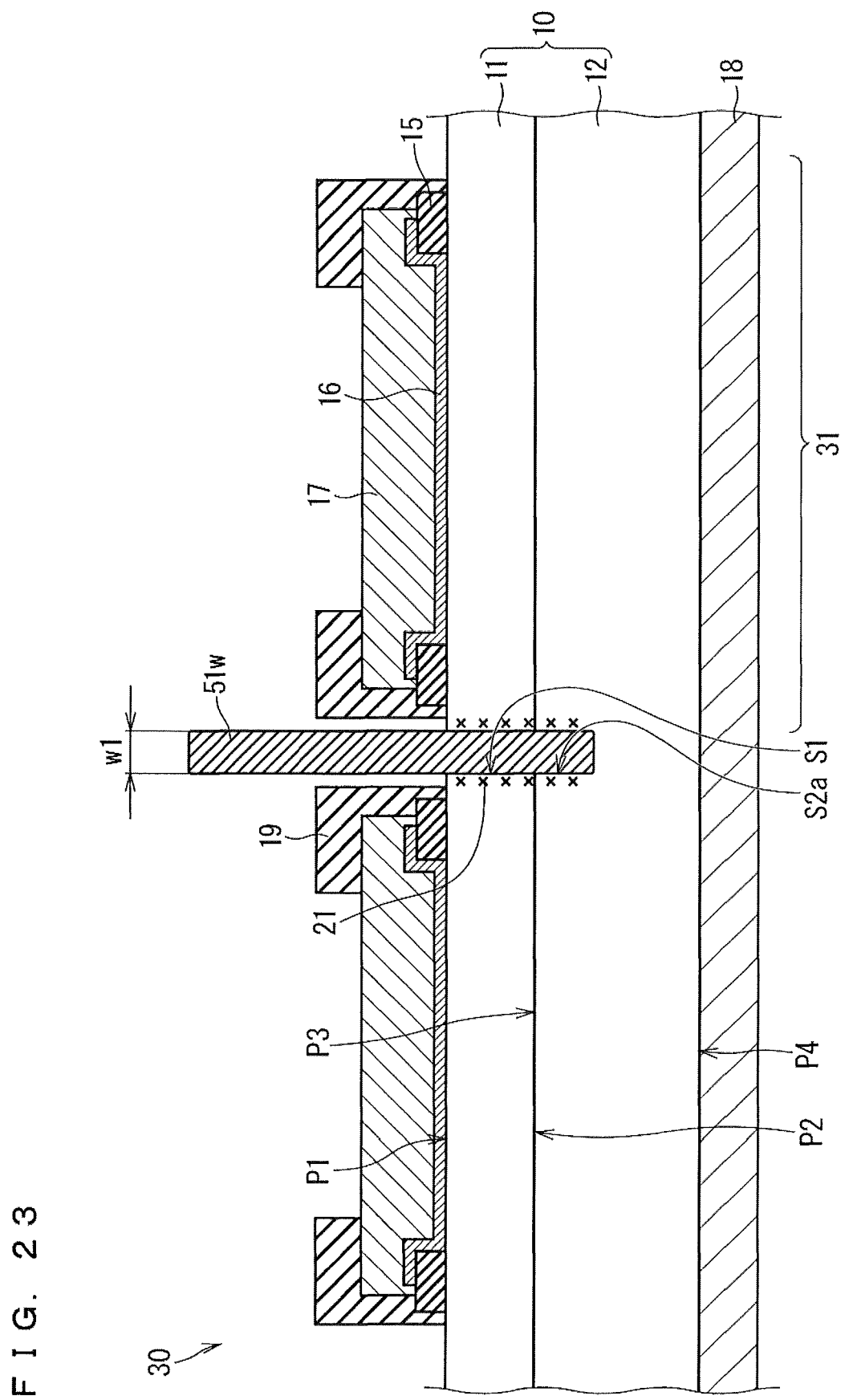
FIG. 23 is a partial sectional view schematically illustrating one step in a method for producing a silicon carbide semiconductor device according to Embodiment 2 of the present invention.
Figure 24:
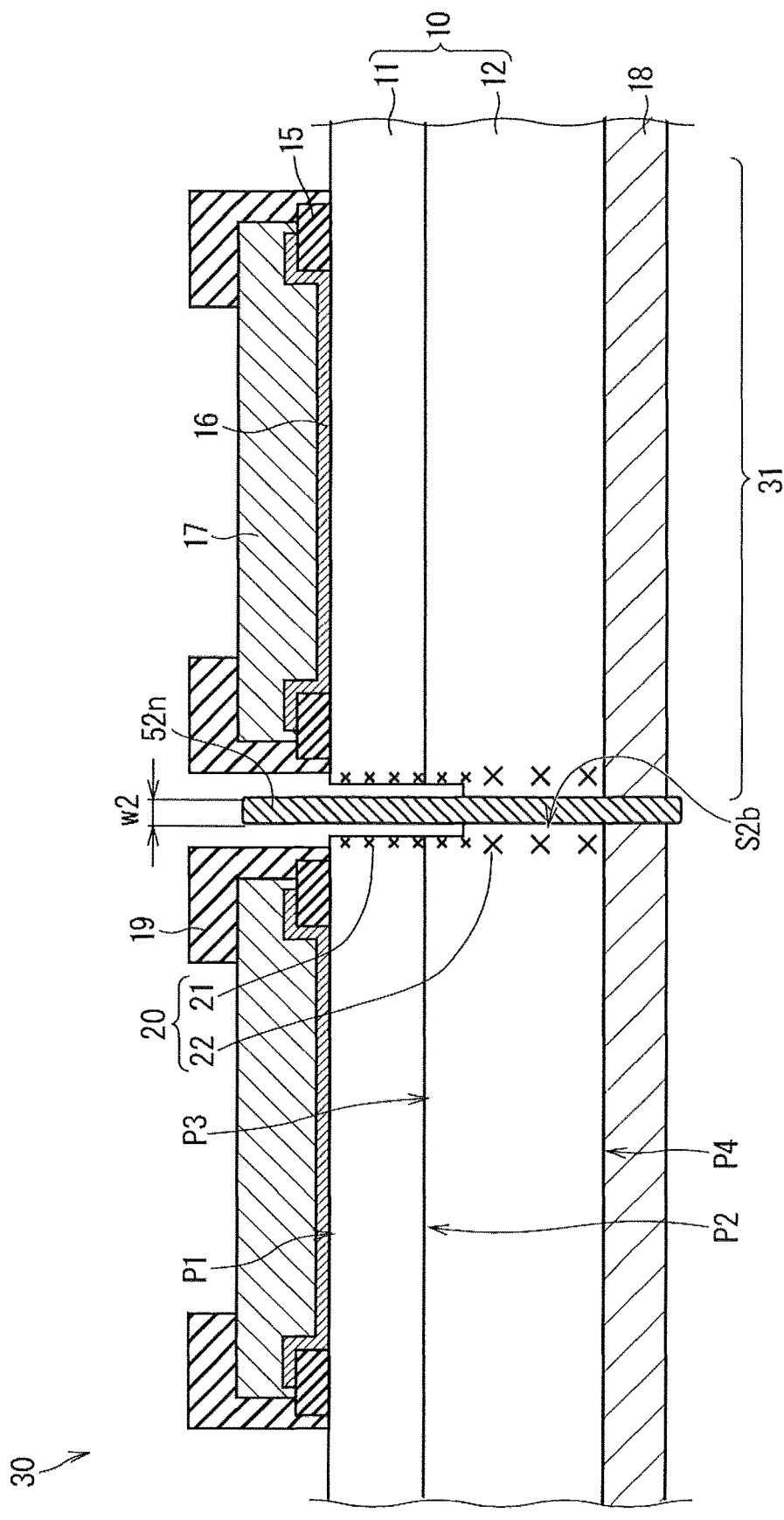
FIG. 24 is a partial sectional view schematically illustrating one step in the method for producing a silicon carbide semiconductor device according to Embodiment 2 of the present invention.

First, the epitaxial wafer 30 (FIG. 12) with semiconductor chips 31 formed thereon is prepared through similar steps to those in Embodiment 1. Then, this epitaxial wafer 30 is diced. FIGS. 23 and 24 are partial sectional views schematically illustrating dicing steps in the method for producing the SBD 92.

Referring to FIG. 23, the side face S1 of the drift layer 11 is formed. For this, a dicing blade 51w with a first width w1 (blade thickness) is used to cut the drift layer 11. In the illustrated example, the portion. S2a of the side face S2 of the SiC substrate 12 is also formed by dicing with the dicing blade 51w.

Referring to FIG. 24, next, the portion S2b of the side face S2 is formed. For this, a dicing blade 52n with a second width w2 (blade thickness) is used to cut the SiC substrate 12. Moreover, the backside electrode layer 18 is also cut with the dicing blade 52n. As a result, the semiconductor chips 31 are cut into individual pieces. That is, the SBD 92 (FIG. 22) is obtained.

The second width w2 is set to be smaller than the first width w1. For example, the first width w1 is set to 50 µm, and the second width w2 is set to 30 µm. That is, a difference in width is set to 20 µm. Also, the accuracy of each width is set to be within ±5 µm. Then, the accuracy of position control of the blades is set to be within ±10 µm. This avoids a situation that the dicing blade 52n (FIG. 24) comes in contact with the previously formed first crush layer 21. Note that these values are illustrative only, and various dicing conditions can be optimized according to actual steps.

The configuration and steps other than those described above are approximately the same as those of Embodiment 1 described above. Thus, identical or corresponding constituent elements are given the same reference signs, and a description thereof is not repeated. Although the boundary between the first crush layer 21 and the second crush layer 22 is disposed on the side face S2 of the SIC substrate 12 in the above description, this boundary may be disposed on the boundary between the drift layer 11 and the SiC substrate 12 as in the case of Embodiment 1.

Effects

According to the present embodiment, the portion S2b (FIG. 22) of the side face S2 of the SiC substrate 12 protrudes out in the in-plane direction farther than the side face of the drift layer 11. Thus, when the side face S2 is formed after the formation of the side face S1 (FIG. 23), particularly in the dicing step of forming the portion S2b of the side face S2, the side face S1 is located at a position more retreated than that of the portion S2*b* as illustrated in FIG. 24. This reduces the possibility that the dicing blade 52*n* comes in contact with the previously formed side face S1. Accordingly, the side face S1 is less susceptible to this dicing step. It is thus possible to stabilize the ultimate thickness of the first crush layer 21 formed on the side face S1. This will be described more specifically hereinafter.

After the step of cutting the drift layer 11 with the dicing blade 51*w* having the first width w1 (FIG. 23), the step of forming the portion S2*b* of the side face S2 (FIG. 24) is performed by cutting the SiC substrate 12 with the dicing blade 52*n* having the second width w2 smaller than the first width w1. Thus, the dicing blade 52*n* can be inserted in the interstice formed with the dicing blade 51*w*, while avoiding contact with the side face S1. Accordingly, it is possible to suppress fluctuations in the thickness of the first crush layer 21 caused by a situation that the dicing blade 52*n* comes in contact with the previously formed side face S1.

Additionally, almost the same effects as those in the case of Embodiment 1 can be achieved with Embodiment 2 of the present invention.

Reference Example

A Production Method According to a Reference Example will be Described hereinafter.

Figure 25:
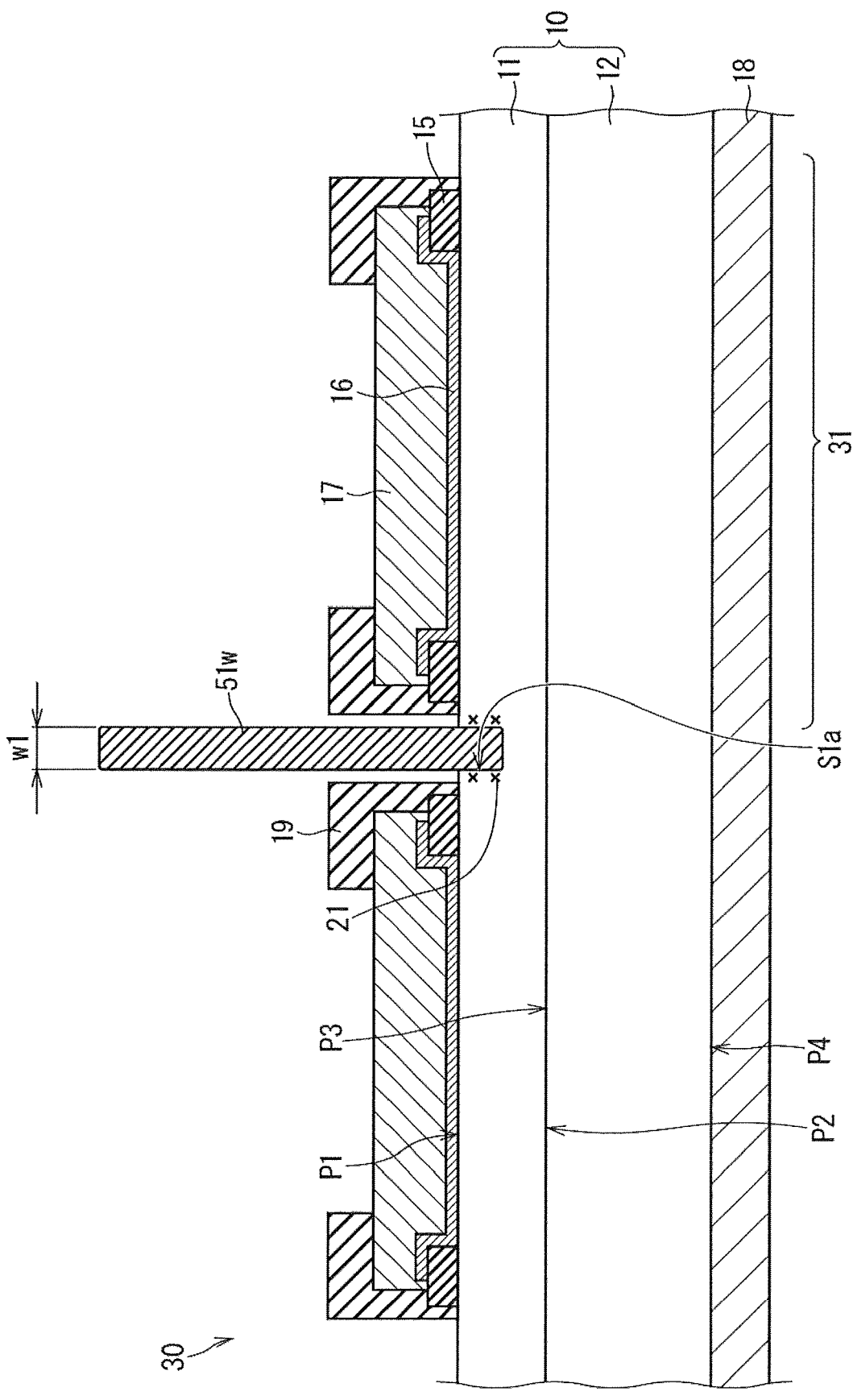
FIG. 25 is a partial sectional view schematically illustrating one step in a method for producing a silicon carbide semiconductor device according to a reference example.

A step illustrated in FIG. 25 is performed, instead of the step in FIG. 23 (Embodiment 2 of the present invention). In this step, only part of the drift layer 11 is cut with the dicing blade 51*w*. Thereby, the portion S1*a* of the side face S1 of the drift layer 11 is formed. As a result of the dicing with the dicing blade 51*w*, the first crush layer 21 is provided on this portion S1*a*. In this reference example, the drift layer 11 is cut partially, or in other words from the face P1 to a location between the faces P1 and P2, with the dicing blade 51*w*. Thus, at this point in time, the side face S1 of the drift layer 11 has not yet been formed entirely.

Figure 26:
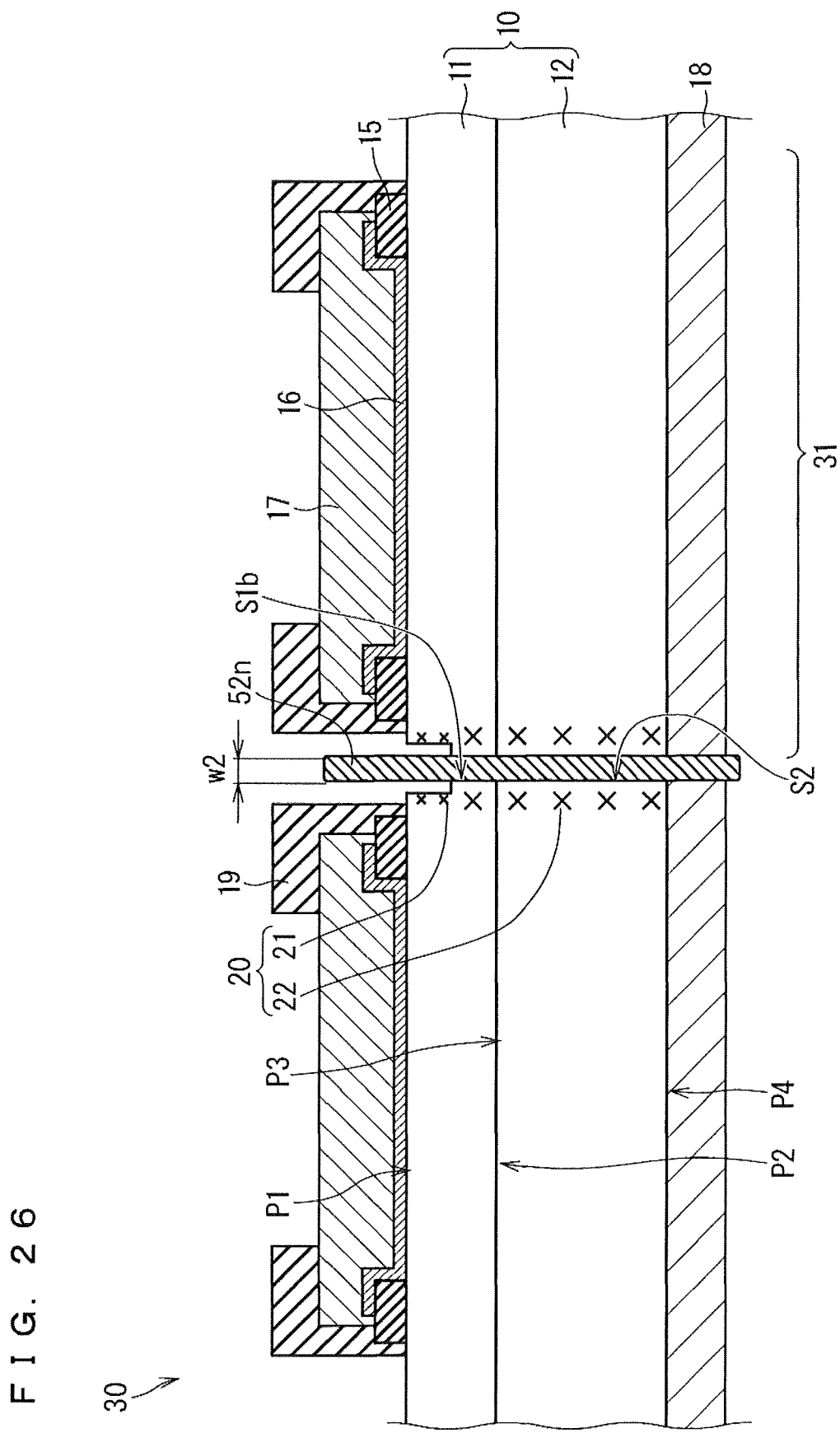
FIG. 26 is a partial sectional view schematically illustrating one step in the method for producing a silicon carbide semiconductor device according to the reference example.
Figure 27:
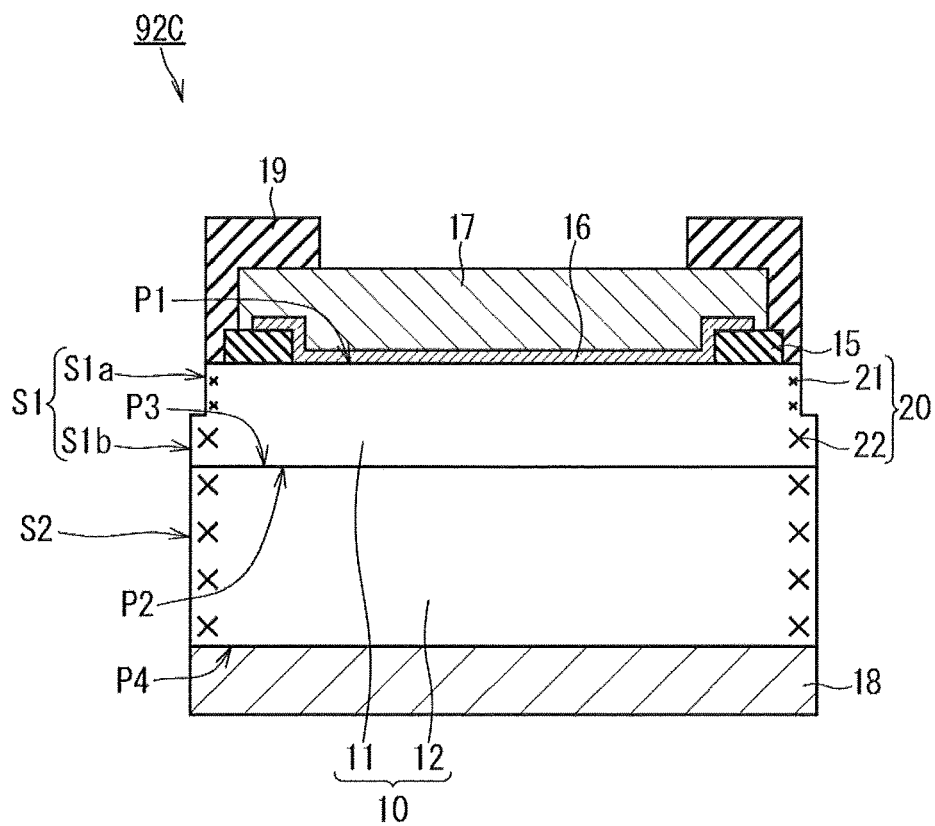
FIG. 27 is a sectional view schematically illustrating a configuration of a silicon carbide semiconductor device according to the reference example.

A step illustrated in FIG. 26 is performed, instead of the step in FIG. 24 (Embodiment 2 of the present invention). In this step, first, the portion S1*b* that is a portion other than the above-described portion S1*a* of the side face S1 of the drift layer 11 is formed by dicing with the dicing blade 52*n*. Then, the side face S2 is formed by cutting the SiC substrate 12 fully from the face P3 to the face P4. As a result of the dicing with the dicing blade 52*n*, the second crush layer 22 is provided on the portion S1*b* of the side face S1 and on the side face S2. Moreover, the backside electrode layer 18 is also cut with the dicing blade 52*n*. Thereby, the semiconductor chips 31 are cut into individual pieces. That is, an SBD 92C (FIG. 27) according to the reference example is obtained.

In the case of the SBD 92C (FIG. 27) according to the reference example, the second crush layer 22 with a greater thickness than that of the first crush layer 21 is formed not only on the side face S2 of the SiC substrate 12 but also on part of the side face S1 of the drift layer 11, unlike in the case of the SBD 92 (FIG. 22) according to the present embodiment. Since a high electric field is applied to the drift layer 11 during switching of the SBD, breakdowns of the SBD will easily occur if the second crush layer 22 is formed to a great thickness on the drift layer 11.

In contrast, in the SBD 92 (Embodiment 2 in FIG. 22), the second crush layer 22 with a greater thickness than that of the first crush layer 21 is formed on only the side face S2 of the SiC substrate 12, and not formed on the side face S1 of the drift layer 11. This suppresses the occurrence of breakdowns of the SBD caused by a high electric field generated during the switching of the SBD. The SBD 91 (Embodiment 1 in FIG. 2) also has similar effects.

Variations

While the SBDs according to Embodiments 1 and 2 described above are formed using the epitaxial wafer 30 (FIG. 4), the silicon carbide semiconductor device is not limited to an SBD, and may be a different type of semiconductor device. According to the type of semiconductor device, the epitaxial wafer 30 may be subjected to processing, such as formation of an insulation film and a metal film, patterning using a photomechanical process and etching, and formation of an impurity layer by ion implantation and activation, to form the desired semiconductor chips 31 (FIG. 12). Depending on the type of semiconductor device, an ohmic electrode layer may be provided as the first electrode layer, instead of the Schottky electrode layer 16 (FIG. 2). Also, depending on the type of semiconductor device, the conductivity types of the SiC substrate 12 and the drift layer 11 may be reversed.

Specifically, the silicon carbide semiconductor device may be a diode of a different type other than the SBD. Also, the silicon carbide semiconductor device is not limited to a diode, and may, for example, be a semiconductor switching element such as a transistor. The transistor may, for example, be an IGBT or a metal insulator semiconductor field effect transistor (MISFET) such as an MOSFET. For example, in order to obtain an n channel-type MISFET, an n-type drain region is configured by a silicon carbide substrate, and an n-type drift layer including a p-type base region and an n-type source region is configured by a semiconductor layer provided on the substrate. The n-type source region is disposed on a first face of the semiconductor layer. The p-type base region separates the n-type source region and the n-type drift layer. The impurity concentration in the n-type drift layer is lower than that in the n-type drain region. A first electrode layer configures a source electrode that is electrically connected to the n-type source region. A second electrode layer configures a drain electrode that is electrically connected to the n-type drain region. If the conductivity type of each configuration is interchanged, the conductivity type of the channel is also reversed. In order to obtain an IGBT, for example, the conductivity type of the silicon carbide substrate in the aforementioned. MISFIT may be reversed. In that case, the first electrode layer and the second electrode layer function as an emitter electrode and a collector electrode, respectively.

The silicon carbide substrate and the semiconductor layer described above are respectively a silicon carbide substrate prepared in advance and a semiconductor layer formed on the silicon carbide substrate by epitaxial growth. However, the silicon carbide substrate and the semiconductor layer are not always limited to those prepared in that way. For example, two layers may be deposited on a single-crystal substrate prepared in advance, and these two layers may be used as a silicon carbide substrate and a semiconductor layer. In this case, the aforementioned single-crystal substrate may be removed during production of the silicon carbide semiconductor device.

Embodiment 3

Configuration

Figure 28:
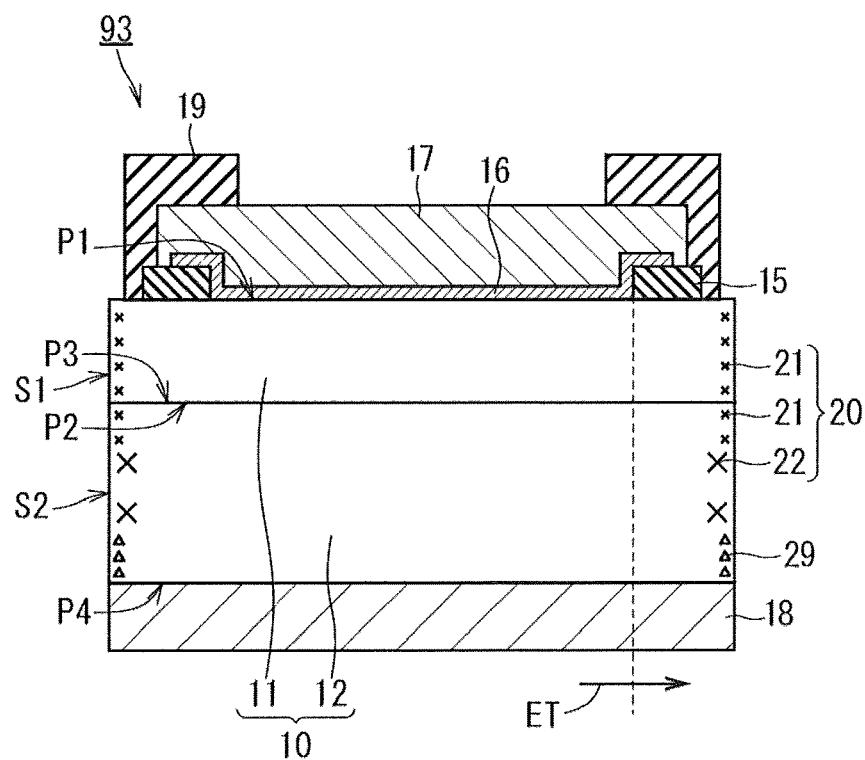
FIG. 28 is a sectional view schematically illustrating a configuration of a silicon carbide semiconductor device according to Embodiment 3 of the present invention.

FIG. 28 is a sectional view schematically illustrating a configuration of an SBD 93 (silicon carbide semiconductor device) according to Embodiment 3 of the present invention.

In the SBD 93, the first crush layer 21 is provided on the side face S1 and on part of the side face S2 as in the SBD 91 (FIG. 2). Specifically, the first crush layer 21 is provided on a portion of the side face S2 that is joined to the face P3.

The second crush layer 22 is provided on a portion of the side face S2. In Embodiment 3 of the present invention, the second crush layer 22 is provided on a portion of the side face S2 that is spaced from each of the faces P3 and P4.

On another portion of the side face S2, a reformed layer 29 is provided. Specifically, the reformed layer 29 is provided on the portion of the side face S2 that is joined to the face P4. Here, the "reformed layer" refers to a layer that includes at least either of amorphous and polycrystalline layers formed during laser processing of the epitaxial substrate 10. Thus, the composition of the reformed layer may slightly vary due to the laser processing. However, if such slight variations are ignored, the composition of the reformed layer is substantially the same as the composition of the base material for the reformed layer. Specifically, the composition of the reformed layer 29 on the side face S2 of the SIC substrate 12 is substantially the same as the composition of the SiC substrate 12. The thickness (lateral dimension in FIG. 28) of the reformed layer 29 is preferably smaller than that of the second crush layer 22.

Production Method

A Method for Producing the SBD 93 will be Described hereinafter.

First, the epitaxial wafer 30 (FIG. 12) with the semiconductor chips 31 formed thereon is prepared through similar steps to those in Embodiment 1. Then, this epitaxial wafer 30 is diced. In the present embodiment, the dicing is implemented by a combination of mechanical dicing and laser dicing as will be described hereinafter.

First, the side face S1 of the drift layer 11 is formed by cutting the drift layer 11 with the dicing blade 51 having the first abrasive grain diameter as an average value as in FIG. 14 (Embodiment 1). As a result of the dicing with the dicing blade 51, the first crush layer 21 is provided on this side face S1. Moreover, the side face S2 is formed partially by cutting the SiC substrate 12 partially from the face P3. As a result of the dicing with the dicing blade 51, the first crush layer 21 is also provided on this side face S2.

Figure 29:
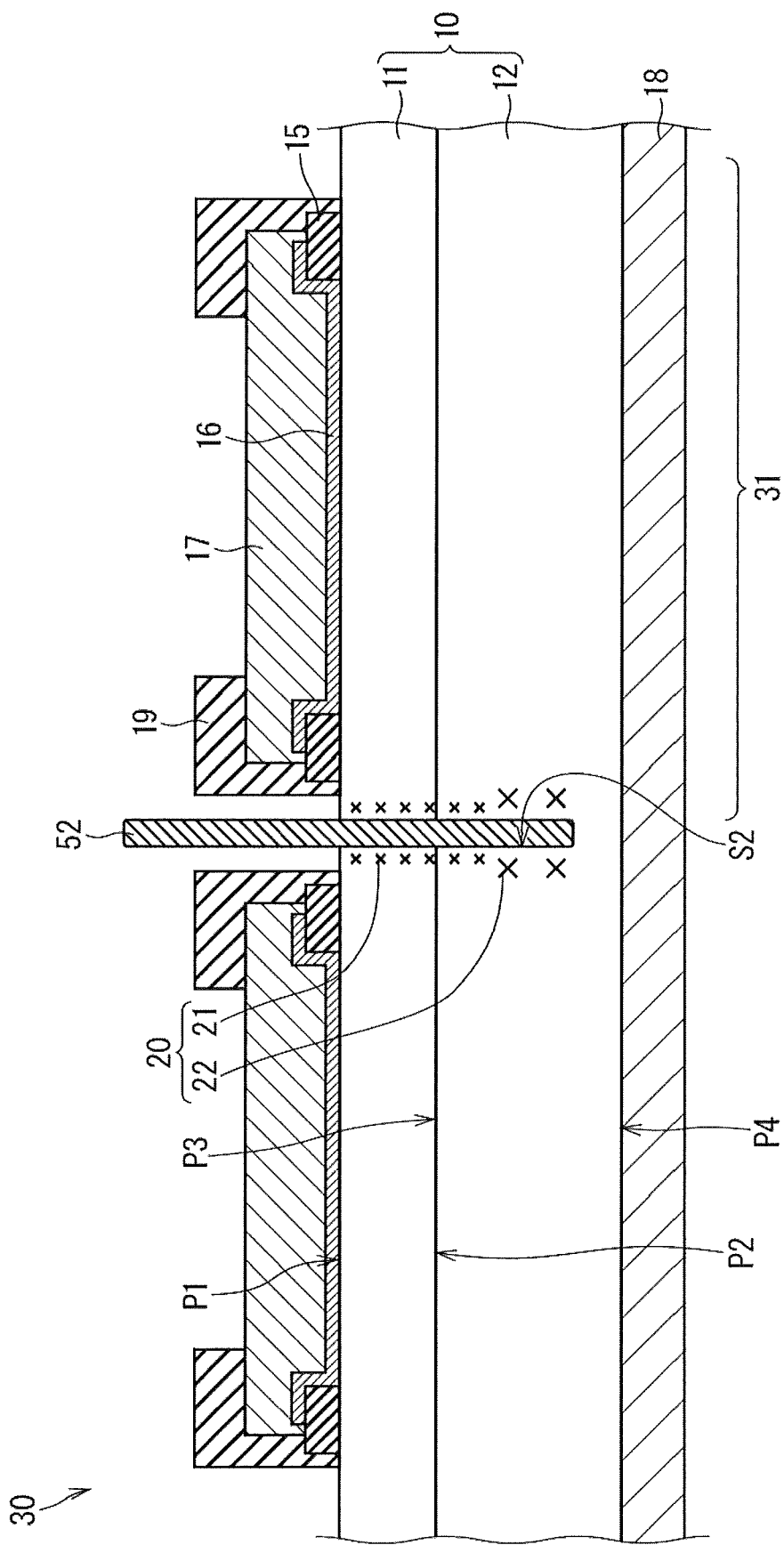
FIG. 29 is a partial sectional view schematically illustrating one step in a method for producing a silicon carbide semiconductor device according to Embodiment 3 of the present invention.

Referring to FIG. 29, next, part of the SIC substrate 12 is cut with the dicing blade 52 having a second abrasive grain diameter as an average value. Thereby, part of the side face S2 of the SiC substrate 12 is formed. As a result of the dicing with the dicing blade 52, the second crush layer 22 is provided on the portion of the side face 52 that is formed by this step.

Figure 30:
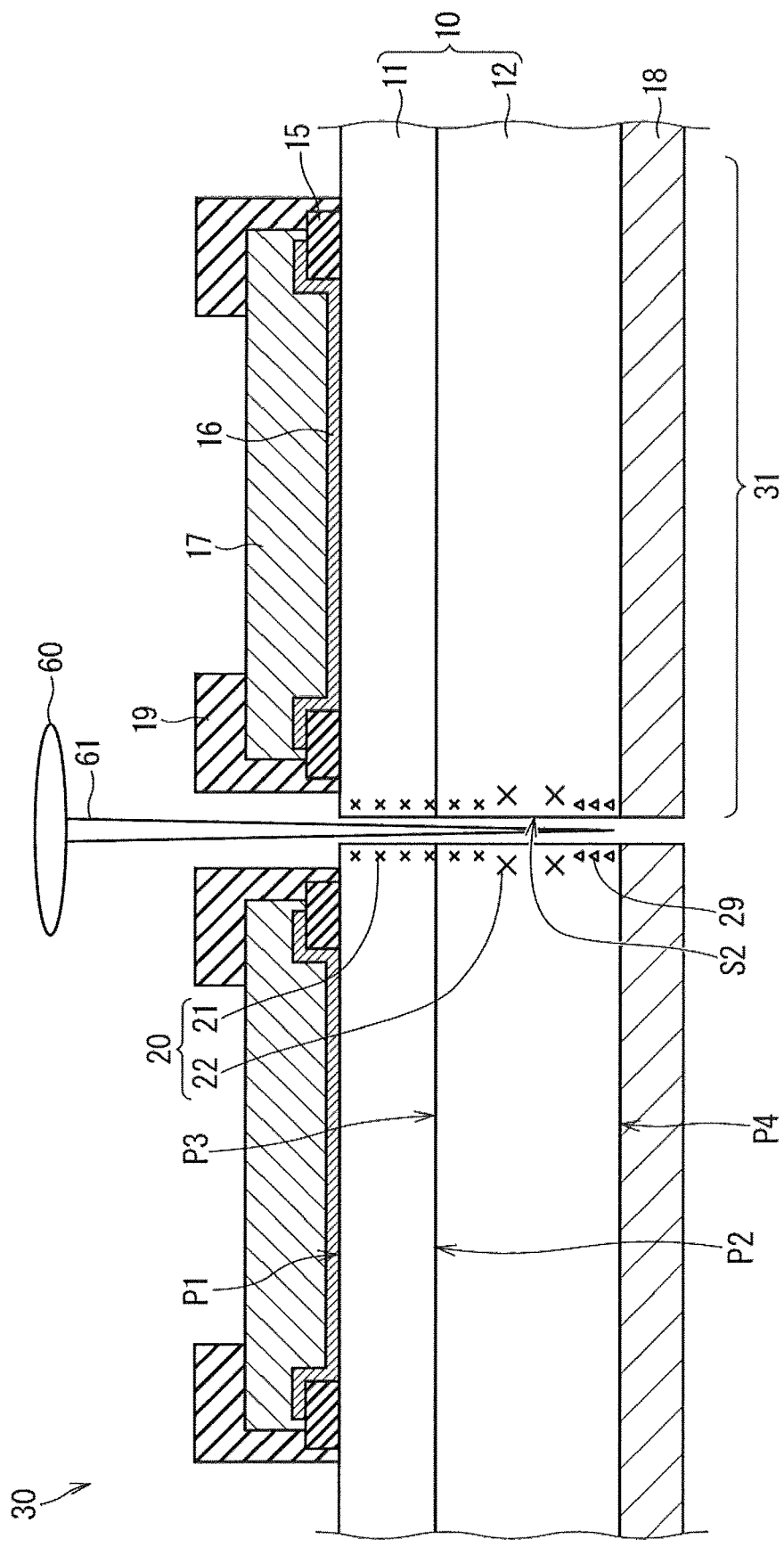
FIG. 30 is a partial sectional view schematically illustrating one step in the method for producing a silicon carbide semiconductor device according to Embodiment 3 of the present invention.

Referring to FIG. 30, next, laser dicing is performed by applying laser light 61 from a laser processing machine 60. Specifically, the laser light 61 is applied to the bottom of the groove formed by the steps up to FIG. 29. Thereby, the remaining portion of the side face S2 of the SiC substrate 12 is formed. As a result of the laser dicing, the reformed layer 29 is provided on the portion of the side face S2 that is formed by this step.

Furthermore, the backside electrode layer 18 is cut by continuing the application of this laser light 61. Thereby, the semiconductor chips 31 are cut into individual pieces.

The dicing may be performed such that, after the drift layer 11 is cut with the dicing blade 51w (FIG. 23) having the first width w1 (blade thickness), the SiC substrate 12 is cut with the dicing blade 52n (FIG. 24) having the second width w2 (blade thickness) smaller than the first width w1, as described in Embodiment 2.

Effects

According to the present embodiment, the portion of the side face S2 of the SiC substrate 12 that is joined to the face P4 is formed by laser processing as illustrated in FIG. 30. Thus, it is possible to suppress the occurrence of chipping at the edge of the face P4, as compared with the case where that portion is formed by mechanical processing. Accordingly, the deflective strength of the chips can be improved.

Figure 31:
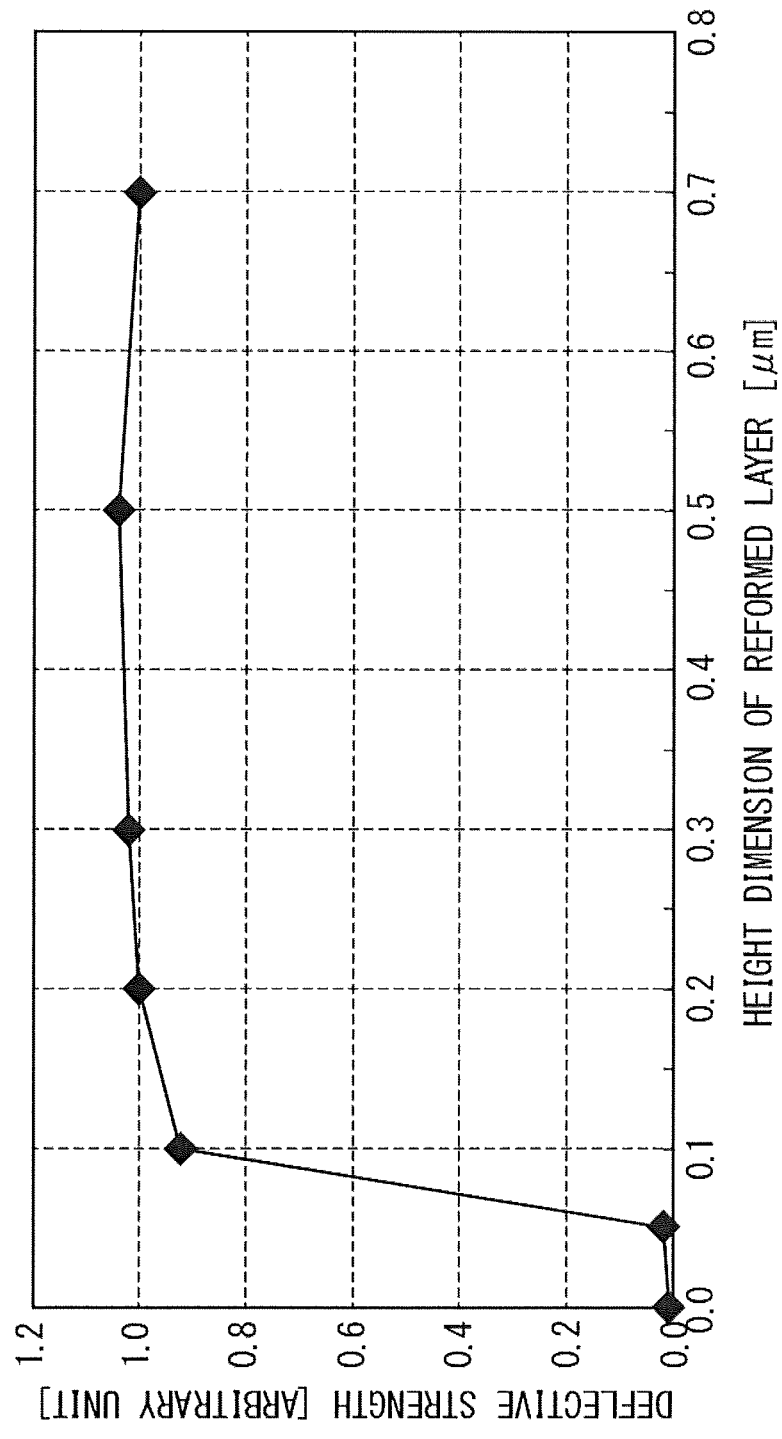
FIG. 31 is a graphical diagram illustrating an exemplary relationship between the height dimension of a reformed layer and the deflective strength of the silicon carbide semiconductor device.

FIG. 31 is a graphical diagram illustrating an exemplary relationship between the height dimension (longitudinal dimension in FIG. 29) of the reformed layer 29 and the deflective strength of the silicon carbide semiconductor device. Here, the height dimension of the reformed layer is defined as a dimension in the direction perpendicular to the in-plane direction, or in other words a dimension in the thickness direction of the epitaxial substrate 10, as in the case of the crush layer. The results shown in this graph indicate that the deflective strength can be improved considerably if the height dimension of the reformed layer 29 is set to be greater than or equal to 0.1 unity.

Experiments conducted by the inventors of the present invention have confirmed that the present embodiment can also achieve similar effects to those described with the experimental results of the failure probability (FIGS. 18 and 19) and the chip cracking percentage (FIG. 21) in Embodiment 1.

Variations

A variation of the method for producing the SBD 93 (Embodiment 3 in FIG. 28) will be described. First, the epitaxial wafer 30 (FIG. 12) with the semiconductor chips 31 formed thereon is prepared through similar steps to those in Embodiment 1. Then, this epitaxial wafer 30 is diced. In the variation of the present embodiment, as will be described hereinafter, dicing is implemented by a combination of laser dicing and mechanical dicing, and a sequence of these two types of dicing is reversed from that in the case of the above-described present embodiment.

Figure 32:
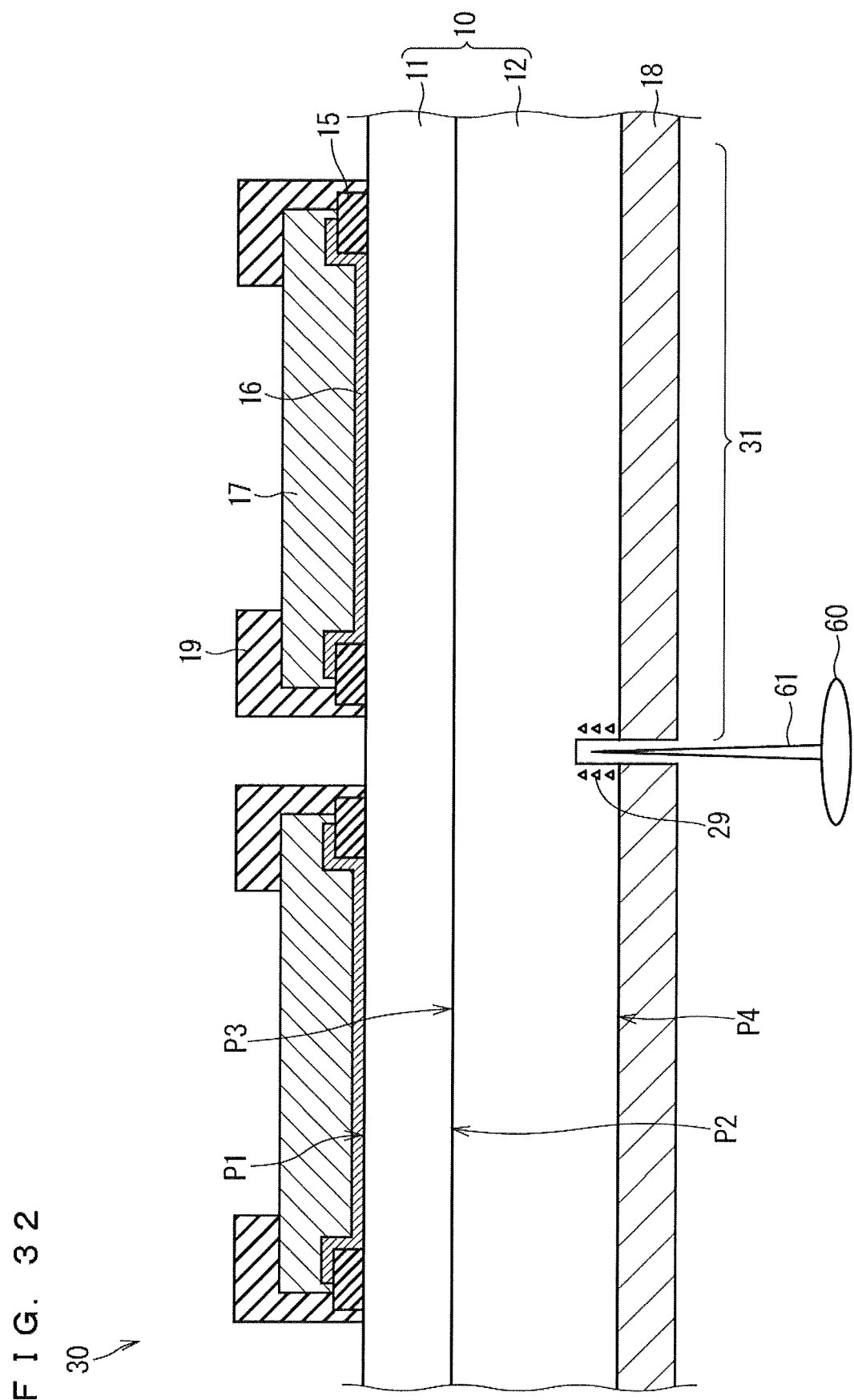
FIG. 32 is a partial sectional view schematically illustrating one step in a method for producing a silicon carbide semiconductor device according to a variation of Embodiment 3 of the present invention.

Referring to FIG. 32, the laser light 61 is applied from the laser processing machine 60 to the backside electrode layer 18. Thereby, the backside electrode layer 18 is cut. Moreover, the reformed layer 29 (see FIG. 30) is formed on the SiC substrate 12 by continuing the application of this laser light 61.

Figure 33:
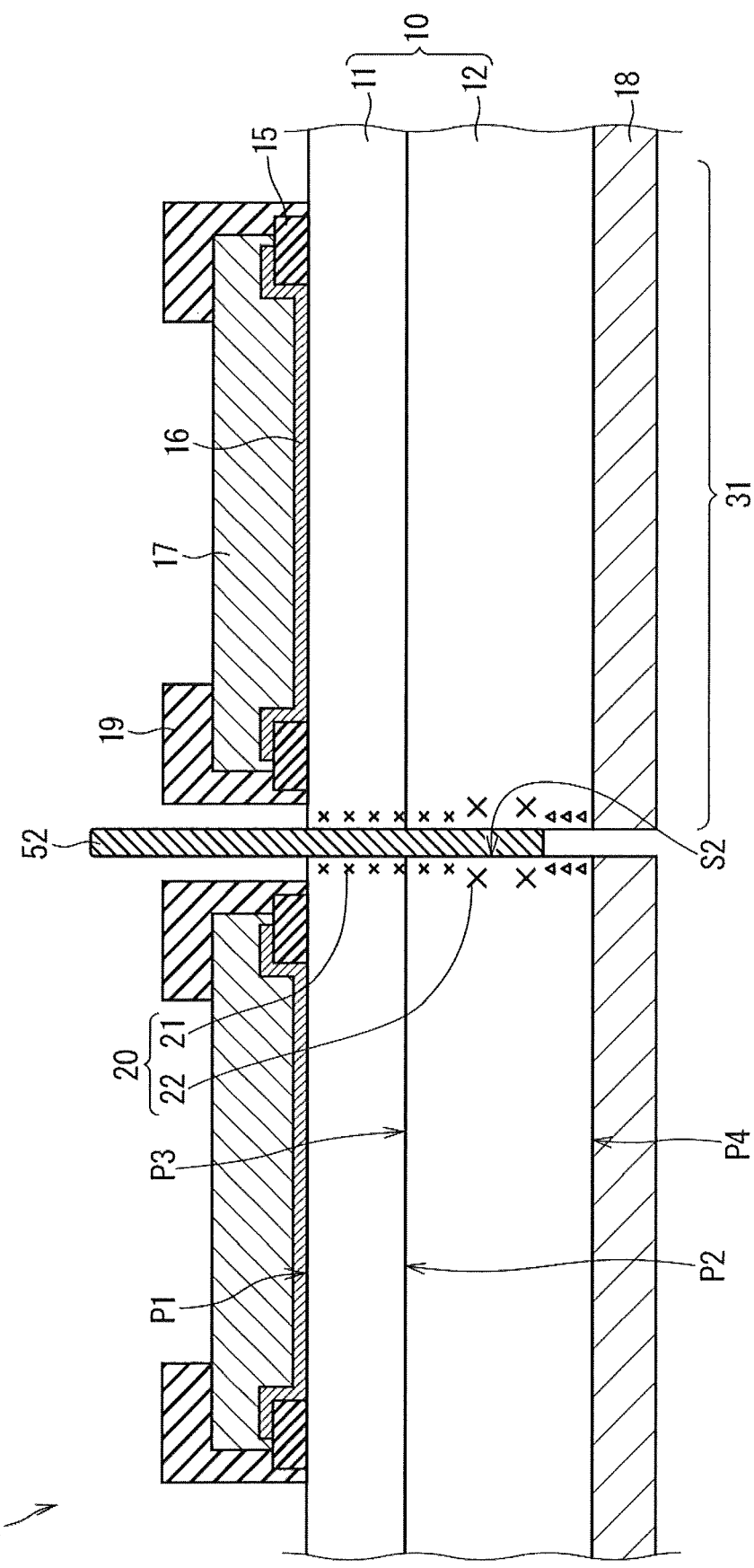
FIG. 33 is a partial sectional view schematically illustrating one step in the method for producing a silicon carbide semiconductor device according to the variation of Embodiment 3 of the present invention.

Referring to FIG. 33, next, similar mechanical dicing to that in the case of Embodiment 3 described above is performed. Thereby, the semiconductor chips 31 are cut into individual pieces.

This variation of the present embodiment can also achieve almost similar effects to those of Embodiment 3 described above.

Embodiment 4

The present embodiment describes a case in which the silicon carbide semiconductor device according to Embodiment 1 or 2 described above is applied to an electric power conversion device. The present invention is not limited to a specific electric power conversion device, but a three-phase inverter will be described hereinafter in detail as an electric power conversion device according to Embodiment 4 of the present invention.

Figure 34:
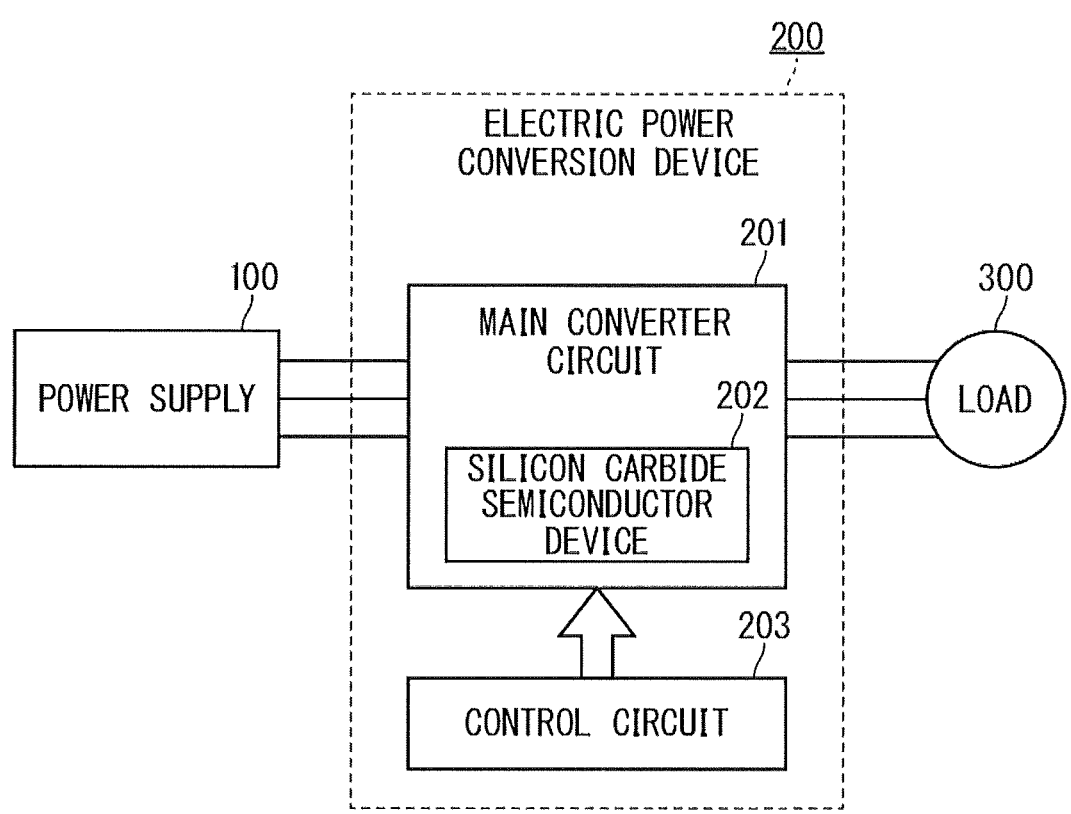
FIG. 34 is a block diagram schematically illustrating a configuration of an electric power conversion device according to Embodiment 4 of the present invention.

FIG. 34 is a block diagram schematically illustrating a configuration of an electric power conversion system that applies an electric power conversion device 200 according to Embodiment 4 of the present invention. This electric power conversion system is configured by a power supply 100, the electric power conversion device 200, and a load 300.

The power supply 100 is a direct-current power supply and supplies direct-current power to the electric power conversion device 200. The power supply 100 can be configured by various constituent elements such as a direct-current system, a solar cell, and a storage battery, or can be configured by a rectifier circuit or an AC/DC converter that is connected to an alternating-current system. As another alternative, the power supply 100 may be configured by a DC/DC converter that converts direct-current power output from a direct-current system into predetermined power.

The electric power conversion device 200 is a three-phase inverter connected between the power supply 100 and the load 300. The electric power version device 200 converts direct-current power supplied from the powersupply 100 into alternating-current power, and supplies the alternating-current power to the load 300. The electric power conversion device 200 includes a main converter circuit 201 and a control circuit 203. The main converter circuit 201 converts input direct-current power into alternating-current power and outputs the alternating-current power. The control circuit 203 outputs a control signal for controlling the main converter circuit 201 to the main converter circuit 201.

The load 300 is a three-phase motor driven by the alternating-current power supplied from the electric power conversion device 200. Note that the use of the load 300 is not limited to specific applications. The load 300 is an electric motor mounted on various types of electrical apparatuses and, for example, may be used as an electric motor for hybrid automobiles, electric automobiles, railway vehicles, elevators, or air conditioners.

The details of the electric power conversion device 200 will be described hereinafter. The main converter circuit 201 includes switching elements and freewheeling diodes (not shown). The main converter circuit 201 converts the direct-current power supplied from the power supply 100 into alternating-current power and supplies the alternating-current power to the load 300 by switching the switching elements. The main converter circuit 201 may take various types of specific circuit configurations. The main converter circuit 201 according to the present embodiment is a two-level three-phase full-bridge circuit and can be configured by six switching elements and six freewheeling diodes that are respectively connected in anti-parallel with the six switching elements. A silicon carbide semiconductor device 202 according to one of Embodiments 1 to 3 and variations thereof described above is applied to at least one of the switching elements and the freewheeling diodes of the main converter circuit 201. Each two of the six switching elements are connected in series and constitute upper and lower arms, and each pair of upper and lower arms constitutes each phase (U phase, V phase, or W phase) of the full-bridge circuit. The output terminals of each pair of upper and lower arms, i.e., three output terminals of the main converter circuit 201, are connected to the load 300.

The main converter circuit 201 also includes a drive circuit (not shown) that drives each switching element. The drive circuit generates drive signals for driving the switching elements of the main converter circuit 201 and supplies the drive signals to the control electrodes of the switching elements of the main converter circuit 201. Specifically, the drive circuit outputs a drive signal for turning a switching element on and a drive signal for turning a switching element off to the gate electrode of each switching element in accordance with the control signal received from the control circuit 203, which will be described later. In the case of maintaining a switching element in the ON state, the drive signal is a voltage signal (ON signal) greater than or equal to the threshold voltage of the switching element. In the case of maintaining a switching element in the OFF state, the drive signal is a voltage signal (OFF signal) less than or equal to the threshold voltage of the switching element.

The control circuit 203 controls the switching elements of the main converter circuit 201 so that desired power is supplied to the load 300. Specifically, the control circuit 203 calculates a time (ON time) when each switching element of the main converter circuit 201 is turned on, on the basis of power that is to be supplied to the load 300. For example, the control circuit 203 can control the main converter circuit 201 by pulse width modulation (PWM) control in which the ON time of each switching element is modulated in accordance with the voltage that is to be output. Then, the control circuit 203 outputs a control command (control signal) to the drive circuit of the main converter circuit 201 so that an ON signal is output to a switching element at each time when the switching element is turned on, and an OFF signal is output to a switching element at each time when the switching element is turned off. In accordance with this control signal, the drive circuit outputs either ail ON signal or an OFF signal as a drive signal to the control electrode of each switching element.

FIG. 35 is a partial sectional view schematically illustrating an exemplary configuration of the main converter circuit 201. In the present example, the main converter circuit 201 includes the silicon carbide semiconductor device 202 that has a similar configuration to that of the SBD 91 (Embodiment 1 in FIG. 2) and a packaging substrate 210. The packaging substrate 210 is bonded to the backside electrode layer 18 of the silicon carbide semiconductor device 202.

A method for producing the electric power conversion device 200 includes the following steps. The silicon carbide semiconductor device 202 is produced by the production method described in the embodiments and variations thereof described above. The main converter circuit 201 including this silicon carbide semiconductor device 202 is formed. Also, the control circuit 203 is formed. As a result, the electric power conversion device 200 is obtained. At the time of forming the main converter circuit 201, the backside electrode layer 18 of the silicon carbide semiconductor device 202 is bonded to the surface of the packaging substrate 210.

According to the present embodiment, the aforementioned silicon carbide semiconductor device 202 is used as at least one of semiconductor devices that configure the main converter circuit 201. Accordingly, it is possible to suppress the occurrence of dielectric breakdowns caused by local current concentration on the drift layer 11 of the semiconductor device while suppressing unexpected adverse influences on the characteristics of the semiconductor device. This improves the reliability of the main converter circuit 201. Thus, the reliability of the electric power conversion device 200 can be improved.

The packaging substrate 210 is also bonded to the backside electrode layer 18 of the silicon carbide semiconductor device 202. Thus, while the semiconductor chip as the silicon carbide semiconductor device 202 is connected to the packaging substrate 210 on the side of the SiC substrate 12, it is exposed upward on the side of the drift layer 11. Accordingly, as compared with the SiC substrate 12, the drift layer 11 is easily affected by external influences (see an arrow S in FIG. 35), particularly the influence of stress from the outside. As a result, cracking can occur in the drift layer 11. According to the present embodiment, the thickness of the crush layer 20 on the side face S1 is smaller than that of the crush layer 20 on the side face S2. This suppresses the occurrence of cracking described above.

Although the present embodiment describes an example in which the present invention is applied to a two-level three-phase inverter, the present invention is not limited to this example and is applicable to various types of electric power conversion devices. Although the present embodiment describes a two-level electric power conversion device as an example, the electric power conversion device may be a three-level or multi-level electric power conversion device. The present invention may also be applied to a single-phase inverter in the case where power is supplied to a single-phase load. In the case where power is supplied to a direct-current load or the like, the present invention is also applicable to a DC/DC converter or an AC/DC converter.

The use of the electric power conversion device that applies the present invention is not limited to the case where the aforementioned load is an electric motor. The electric power conversion device may be used as, for example, a power supply device for electric discharge machines or laser processing machines or for dielectric heating cooking appliances or non-contact power supply systems. The electric power conversion device may also be used as a power conditioner in systems such as photovoltaic power generating systems or condenser systems.

Note that embodiments of the present invention may be freely combined or appropriately modified or omitted within the scope of the present invention. While the invention has been shown and described in detail, the foregoing description is in all aspects illustrative and not restrictive. It is therefore understood that numerous modifications and variations can be devised without departing from the scope of the invention.

EXPLANATION OF REFERENCE SIGNS

P1 to P4: first to fourth faces, S1, S2: first and second side faces, 10: epitaxial substrate, 11: drift layer (semiconductor layer), 12: SiC substrate (silicon carbide substrate), 15: interlayer insulating layer (insulation film), 16: Schottky electrode layer (first electrode layer), 17: frontside electrode layer, 18: backside electrode layer (second electrode layer), 19: passivation layer, 20: crush layer, 21: first crush layer, 22: second crush layer, 29: reformed layer, 30: epitaxial wafer, 31: semiconductor chip, 51, 51w, 52, 52n: dicing blade, 60: laser processing machine, 61: laser light, 90 to 93: SBD (silicon carbide semiconductor device), 100: power supply, 200: electric power conversion device, 201: main converter circuit, 202: silicon carbide semiconductor device, 203: control circuit, 210: packaging substrate, 300: load.

The invention claimed is:

1. A silicon carbide semiconductor device comprising:
a semiconductor layer having a first face, a second face opposite the first face, and a first side face that connects the first face and the second face;
a silicon carbide substrate having a third face that faces the second face, a fourth face opposite the third face, and a second side face that connects the third face and the fourth face;
a first electrode layer disposed apart from an edge of the first face of the semiconductor layer and forming an interface with part of the first face; and
a second electrode layer provided on the fourth face of the silicon carbide substrate and extending outward of the interface between the first face of the semiconductor layer and the first electrode layer in an in-plane direction,
wherein a crush layer is provided on the first side face of the semiconductor layer and on the second side face of the silicon carbide substrate, and a thickness of the crush layer on the second side face is greater than a thickness of the crush layer on the first side face.

2. The silicon carbide semiconductor device according to claim 1, wherein
the second side face has a first portion joined to the third face, and a second portion joined to the fourth face, and
the thickness of the crush layer on the first side face and a thickness of the crush layer on the first portion of the second side face are each smaller than a thickness of the crush layer on the second portion of the second side face.

3. The silicon carbide semiconductor device according to claim 1, wherein
the semiconductor layer has an impurity concentration lower than an impurity concentration of the silicon carbide substrate.

4. The silicon carbide semiconductor device according to claim 3, wherein
the second side face has a first portion joined to the third face, and a second portion joined to the fourth face, and
the thickness of the crush layer on the first side face and a thickness of the crush layer on the first portion of the second side face are each smaller than a thickness of the crush layer on the second portion of the second side face.

5. The silicon carbide semiconductor device according to claim 1, wherein
the thickness of the crush layer on the second side face of the silicon carbide substrate is greater than or equal to 0.1 μm.

6. The silicon carbide semiconductor device according to claim 1, wherein
at least part of the second side face of the silicon carbide substrate protrudes out in the in-plane direction farther than at least part of the first side face of the semiconductor layer.

7. An electric power conversion device comprising:
a main converter circuit that includes the silicon carbide semiconductor device according to claim 1 and converts and outputs input power; and
a control circuit that outputs a control signal for controlling the main converter circuit to the main converter circuit.

8. The electric power conversion device according to claim 7, wherein
the main converter circuit includes a packaging substrate that is bonded to the second electrode layer of the silicon carbide semiconductor device.

9. A method for producing a silicon carbide semiconductor device, comprising the steps of:
preparing a wafer that includes a semiconductor layer having a first face and a second face opposite the first face, a silicon carbide substrate having a third face that faces the second face of the semiconductor layer and a fourth face opposite the third face, a first electrode layer forming an interface with part of the first face, and a second electrode layer provided on the fourth face of the silicon carbide substrate and extending outward of the interface between the first face of the semiconductor layer and the first electrode layer in an in-plane direction; and
dicing the wafer,
wherein the step of dicing the wafer includes the steps of:

forming a first side face that connects the first face and the second face, by cutting the semiconductor layer; and forming a second side face that connects the third face and the fourth face, by cutting the silicon carbide substrate, and the step of dicing the wafer is performed so that a crush layer is formed on the first side face of the semiconductor layer and on the second side face of the silicon carbide substrate, and that a thickness of the crush layer on the second side face becomes greater than a thickness of the crush layer on the first side face.

10. The method for producing the silicon carbide semiconductor device according to claim 9, wherein the step of forming the first side face includes a step of cutting the semiconductor layer with a dicing blade having a first abrasive grain diameter, and the step of forming the second side face includes a step of cutting the silicon carbide substrate with a dicing blade having a second abrasive grain diameter greater than the first abrasive grain diameter.

11. The method for producing a silicon carbide semiconductor device according to claim 10, wherein the second abrasive grain diameter is greater than or equal to 3 μm.

12. The method for producing the silicon carbide semiconductor device according to claim 9, wherein the step of forming the first side face includes a step of cutting the semiconductor layer with a dicing blade having a first width, and the step of forming the second side face includes a step of cutting the silicon carbide substrate with a dicing blade having a second width smaller than the first width after the step of cutting the semiconductor layer with the dicing blade having the first width.

13. A method for producing an electric power conversion device, comprising the steps of:

producing a silicon carbide semiconductor device by the method for producing a silicon carbide semiconductor device according to claim 9; and forming a main converter circuit that includes the silicon carbide semiconductor device and converts and outputs input power, and a control circuit that outputs a control signal for controlling the main converter circuit to the main converter circuit.

14. The method for producing the electric power conversion device according to claim 13, wherein the step of forming the main converter circuit includes a step of bonding the second electrode layer of the silicon carbide semiconductor device to a surface of a packaging substrate.

* * * * *

UNITED STATES PATENT AND TRADEMARK OFFICE
CERTIFICATE OF CORRECTION

PATENT NO. : 10,804,360 B2  
APPLICATION NO. : 16/487176  
DATED : October 13, 2020  
INVENTOR(S) : Kazunari Nakta Page 1 of 1

It is certified that error appears in the above-identified patent and that said Letters Patent is hereby corrected as shown below:

On the Title Page

Item (22) PCT Filed:, change "Apr. 4, 2018" to --April 6, 2018--.

Signed and Sealed this  
Twenty-second Day of December, 2020

Andrei Iancu  
*Director of the United States Patent and Trademark Office*